(12) United States Patent
Doty

(10) Patent No.: US 12,332,329 B2
(45) Date of Patent: Jun. 17, 2025

(54) NMR PROBE FOR EFFICIENT MAS-DNP OPERATION AT ULTRA-LOW TEMPERATURES

(71) Applicant: Doty Scientific, Inc., Columbia, SC (US)

(72) Inventor: F David Doty, Columbia, SC (US)

(73) Assignee: Doty Scientific, Inc., Columbia, SC (US)

( * ) Notice: Subject to any disclaimer, the term of this patent is extended or adjusted under 35 U.S.C. 154(b) by 0 days.

(21) Appl. No.: 18/873,047

(22) PCT Filed: Aug. 22, 2024

(86) PCT No.: PCT/IB2024/058183
§ 371 (c)(1),
(2) Date: Dec. 9, 2024

(87) PCT Pub. No.: WO2025/046415
PCT Pub. Date: Mar. 6, 2025

(65) Prior Publication Data
US 2025/0172642 A1 May 29, 2025

Related U.S. Application Data

(60) Provisional application No. 63/580,298, filed on Sep. 1, 2023.

(51) Int. Cl.
*G01R 33/31* (2006.01)
*G01R 33/30* (2006.01)
(Continued)

(52) U.S. Cl.
CPC ........... *G01R 33/31* (2013.01); *G01R 33/307* (2013.01); *G01R 33/3403* (2013.01); *G01R 33/3804* (2013.01)

(58) Field of Classification Search
CPC .. G01R 33/31; G01R 33/307; G01R 33/3403; G01R 33/3804
See application file for complete search history.

(56) References Cited

U.S. PATENT DOCUMENTS

| 4,456,882 A | 6/1984 | Doty |
| 4,940,942 A | 7/1990 | Bartuska |

(Continued)

FOREIGN PATENT DOCUMENTS

| EP | 1760480 A1 | 3/2007 |
| KR | 10-2015-0029942 A | 3/2015 |

OTHER PUBLICATIONS

International Search Report in PCT/IB2024/058183, mailed Dec. 9, 2024.

(Continued)

*Primary Examiner* — G.M. A Hyder
(74) *Attorney, Agent, or Firm* — Oppedahl Patent Law Firm LLC

(57) ABSTRACT

An NMR probe for insertion into an NMR magnet from below is disclosed that includes multiple counterflow heat exchangers to enable a wide range of NMR methods at ultra low temperatures, including MAS DNP at temperatures below 15 K. Coolant fluid is ducted from the bottom of the probe through a vacuum insulated transfer line up into the probehead, the region containing the sample and sample coil, where it splits into first and second coolant streams for cooling first and second spin-gas streams, each through a cold counterflow exchanger and at least one cool counterflow exchanger contained within the probe.
The cold exchangers would each preferably comprise two straight continuously joined tubes inside a dewared tube that extends from a vacuum chamber in the base of the probe up (Continued)

into the probehead. These cold exchangers are denoted as Dual Inner Tube Exchangers (DITEs). The cool exchanger is preferably a coil of two parallel continuously thermally joined tubes, and it is denoted as a Parallel Tube Recuperator (PTR).

The first coolant-stream in the probehead feeds into the top of DITE-1, through which the first coolant stream flows downward, providing final cooling to the first spin gas stream which is flowing upward past it into the probehead. The first coolant stream leaving the bottom end of DITE-1 then enters the cooler end of a first PTR in an evacuated chamber in the base of the probe and proceeds through the first PTR to its warmer end in counter-current to the first spin gas stream which had entered at the warmer end of first PTR, exited at its cooler end, and proceeded into the bottom end of DITE-1. An additional PTR may be series connected to the first PTR to further improve the overall effectiveness of heat transfer from first spin gas stream to the first coolant stream.

In like manner, the second coolant stream cools a second spin gas stream.

The exchangers are designed to permit fast MAS at temperatures below 15 K when the probe is supplied with room-temperature helium spin gas streams at commonly used pressures and a helium coolant stream at less than 170 kPa from a standard portable helium cryostat. Liquid helium usage rate is typically in the 2-12 L/hr range, depending on the spinning rate and sample temperature. Both the spin gases and the coolant fluid are fully recoverable without contamination for recycling using the standard helium recycling methods and equipment (with minor upgrades) commonly found in many NMR laboratories.

17 Claims, 11 Drawing Sheets

(51) Int. Cl.
  *G01R 33/34* (2006.01)
  *G01R 33/38* (2006.01)

(56) References Cited

U.S. PATENT DOCUMENTS

| | | | |
|---|---|---|---|
| 5,202,633 | A | 4/1993 | Doty |
| 5,508,613 | A | 4/1996 | Kotsubo |
| 7,141,979 | B2 | 11/2006 | Marek |
| 7,151,374 | B2 | 12/2006 | Doty |
| 7,170,292 | B2 | 1/2007 | Doty |
| 7,282,919 | B2 | 10/2007 | Doty |
| 7,915,893 | B2 | 3/2011 | Shevgoor |
| 8,212,559 | B2 | 7/2012 | Armbruster |
| 10,209,329 | B2 | 2/2019 | Bouleau |
| 10,712,298 | B2 | 7/2020 | Barnes |
| 2005/0068034 | A1* | 3/2005 | Morita ............ G01R 33/31 324/318 |
| 2015/0177341 | A1* | 6/2015 | De Paepe ............ G01R 33/31 324/309 |
| 2016/0223628 | A1 | 8/2016 | Fujiwara |
| 2022/0018915 | A1 | 1/2022 | Schwartz |

OTHER PUBLICATIONS

Written Opinion in PCT/IB2024/058183, mailed Dec. 9, 2024.
Yuanxin Li et al., Solid-state MAS NMR at ultra low temperature of hydrated alanine doped with DNP radicals. Journal of Magnetic Resonance 333 (2021) 107090. Oct. 19, 2021.
Sesti EL, Alaniva N, Rand PW, . . . Saliba EP, Scott FJ, Barnes AB, "Magic angle spinning NMR below 6 K . . . ", J. Magn. Reson., 286:1-9, (2018).
Lipton AS, Sears JA, and Ellis PD, "A General Strategy for the NMR Observation of half-integer Quadrupolar Nuclei in Dilute Environments", J. Magn. Reson. 151:48-59.
Barnes AB, Mak-Jurkauskas ML, Matsuki Y, Bajaj VS, van der Wel PCA, DeRocher R, Bryant J, Sirigiri JR, Temkin RJ, . . . Griffin RG, J. Magn. Reson. 198,2, 261-270 (2009).
Thurber TR, Yau W-M, Tycko R, Low-Temperature Dynamic Nuclear Polarization at 9.4 Tesla With a 30-mW Microwave Source, J. Magn. Reson., 204:303-313, (2010).
Horri F, Idehara T, Fujii Y, Ogawa I, Horri A, Entzminger G, Doty, FD, "Development of DNP-Enhanced . . . " J Infrared Mili Terahz Waves 33, 756-765 (2012).
Matsuki Y, Ueda K, Idehara T, Ikeda R, Ogawa I, Nakamura S, Toda M, Anai T, Fujiwara T, "Helium-cooling and-spinning . . . at 14 T and 30 K", J. Magn. Reson., 225:1-9, (2012).
Thurber KR, Potapov A, Yau WM, Tycko R, Solid-state NMR with MAS and DNP below 25 K, J. Magn. Reson., 226:100-106 (2013).
Bouleau E, Saint-Bonnet P, Mentink-Vigier F, . . . De Paepe G, "Pushing NMR sensitivity limits using . . . helium sample spinning", Chem. Sci. (2015).
Matsuki Y, Nakamura S, Fukui S, Suematsu H, Fujiwara T, "Closed-cycle cold helium magic-angle spinning . . . ", J. Magn. Reson., 259:76-81, (2015).
Albert BJ, Pahng H, Alaniva N, Sesti EL, . . . Scott FJ, Choi EJ, Barnes AB, "Instrumentation for . . . 90 L of liquid nitrogen per day", J. Magn. Reson., 283:71-78, (2017).
Arcon D, Heinmaa K, and Stern R, Chapter 8. Low-temperature NMR: Techniques and Applications, . . . , 231-61. Cambridge: Royal Society of Chemistry, 2018.

* cited by examiner

NMR PROBE FOR EFFICIENT MAS-DNP OPERATION AT ULTRA-LOW TEMPERATURES

FIELD OF THE INVENTION

The field of this invention is a probe for Nuclear Magnetic Resonance (NMR) at temperatures well below 80 K, and even approaching 7 K, and more specifically, an NMR Magic Angle Spinning (MAS) MAS Dynamic Nuclear Polarization (DNP) probe that incorporates multiple compact high effectiveness counterflow heat exchangers.

BACKGROUND OF THE INVENTION

Because of the richness of the information available from NMR, it has often been argued that NMR is the most powerful analytical technique for molecular structure determination. However, NMR has been more successful with liquids or materials dissolved in solvents than with rigid solids. The basic problem in NMR of solids, or solid-state-NMR (ssNMR) as it is commonly denoted, is that rapid molecular tumbling and diffusion are not naturally present to average out chemical shift anisotropy and dipolar couplings of abundant spin nuclides. Hence, the lines are normally broad and unresolved (often hundreds of ppm in width). Many techniques have been developed to improve the resolution in solid-state NMR (ssNMR), and most modern techniques include extremely rapid spinning of the sample at the "Magic Angle" (the zero of the second Legendre polynomial, 54.7°) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are often obtained from the combination of Magic Angle Spinning (MAS) and multiple-pulse methods. However, MAS ceases to be effective when the resonances are too broad to break into an interpretable pattern of sidebands at spinning rates achievable with a meaningful sample size. Linewidths on quadrupolar nuclides are often several 100 kHz (magnet field dependent), and these include metalloproteins with nuclides such as: $^{43}Ca$, $^{25}Mg$, $^{67}Zn$, and $^{39}K$. Despite substantial recent progress with novel pulse sequences, getting sufficient S/N from such cases remains a major challenge.

The primary limitation of NMR is its low sensitivity (S/N). Since the 1990's a standard method for improving S/N in NMR probes for liquid samples has been cryogenic cooling of the sample coils and capacitors, typically to the 25 to 40 K range, while the sample is maintained near room temperature (RT). This typically permits a factor of 4 increase in S/N, and that often translates into a factor of 16 reduction in signal acquisition time. For that reason, most high-field NMR signal acquisition is currently done with such probes.

The benefit of cryogenic cooling can easily be much greater for solid samples because in ssNMR one can also cool the sample, and in so doing benefit from the increase in S/N that comes from the increased Boltzmann factor (inverse with temperature). MAS probes for operation down to ~100 K at moderate speeds have been commercially available for over three decades. MAS below the nitrogen limit, however, has been a very different story. While at least 9 different groups have put substantial efforts into such over the past three decades, the first commercially available MAS probe that could be considered to be capable of routine operation below 85 K was delivered (by JEOL, an MAS-DNP 3.2-mm 14-T probe down to 25 K) only in 2020, and at a price and laboratory space requirement that apparently only one research group has found acceptable.

When the MAS capability is left out of the ssNMR probe, building a successful non-spinning (static) ssNMR probe for operation below 40 K, or even down to 4.2 K is not terribly difficult. There have been numerous successful demonstrations of such over the past four decades by various research groups. These probes generally have been designed to be inserted from above the magnet into a commercially available cryostat (that typically fits inside the RT shim bore and extends from the top of the magnet to below the center of field), as that simplifies several design issues when the sample is not expected to be changed more than once a day and when neither MAS nor Dynamic Nuclear Polarization (DNP) are involved. However, for most ssNMR groups, designing and fabricating their own special-purpose NMR probe with limited capability and applicability is not an option. Moreover, for them to justify the purchase of a new NMR probe it must deliver major benefits for a wide range of users and applications, which means it ideally should be capable of MAS, DNP, double-broad-band triple (and even quadruple) resonance, and stable operation over a wide temperature range, and it must be easy to set up and operate at low cost. More specifically, one needs to be able to warm it up, change samples, and cool it down (with low cryogen cost) in about an hour, not the 12+ hours typically seen with prior purpose-built static NMR probes for operation below 80 K, a sample temperature regime that has been designated "Ultra Low Temperature" (ULT) in NMR research, as it has been generally inaccessible to most NMR researchers (though researchers in some other fields might laugh at calling 35 K sample temperatures "ULT").

For a ULT NMR probe to be of interest to more than a few specialized researchers, it will need to be compatible with commercial DNP systems, and it must be affordable. For compatibility with commercial DNP systems, the probe and the microwaves must come in from below the magnet. Such a ULT probe, even without MAS, has not previously been known.

Rather than add the equipment costs associated with a complex purpose-built helium recycling cryo-system, it makes more sense to design the ULT NMR-DNP probe to operate efficiently from the liquid helium (Lhe or "liter of liquid helium") that is obtained on-site from a standard helium recycling system. Such are currently in place in most NMR laboratories that have more than three NMR spectrometers, and more labs are steadily acquiring them. Importantly, this would make ULT NMR-MAS-DNP available at a cost that perhaps 50 times as many ssNMR groups would see as within a possible budget. While the recycling system currently in place in the typical laboratory may not have the capacity to recycle the amount of LHe and He gas needed for ULT MAS to operate more than a few days per month, it would likely be able to handle the LHe requirements for static (non-spinning, or wide-line) ULT several days a week in the inventive probe; and the standard helium recycling system could be upgraded to handle the needs of ULT MAS several days per week at a cost possibly an order of magnitude less than the cost of a purpose-built ULT MAS cryo-system. Moreover, there would be no need to find space for several additional large pieces of equipment in a lab likely already crowded.

On-site recycled LHe is not very expensive but it is still not cheap when equipment amortization and overhead are included (perhaps ~$8/LHe in 2023 USD in the US, for example), and that justifies the level of cryogenic system optimization seen in the inventive probe, which enables dramatic reduction in amortized operating costs compared to known alternatives.

The first key to dramatically simplifying ULT-MAS is to have a single coolant loop to the probe, with compact high-effectiveness (high-ε) heat exchangers in the probe that cool the helium streams in the probe for the spinner and sample. With such, the bearing and drive gas streams can enter the base of the probe at room temperature and be cooled to below 10 K (depending on flow rates) by the exchangers in the probe. When spin gas flow rates are very low, as is the case with small spinners, the heat leaks in the transfer lines and couplings must be near zero if one is to transfer the cold spin gases from the external refrigeration system to the probe with an acceptable temperature increase. That is a huge challenge that is eliminated by instead cooling the spin gases in the probe. The probe's exchangers are mostly in an evacuated chamber in the probe base but continue along the gas route from there up to the spinner assembly. Without an expensive purpose-built closed-loop cryo-system, compact high-ε exchangers are essential for ULT MAS, as the spin gases must be at high pressure (over 400 kPa, absolute) while the coolant must be at low pressure (under 170 kPa) if standard portable cryostats are to be used.

The second key to ULT-MAS is getting the coolant stream to where it is really needed in the probehead with minimal heat leak. For that, suitable overlapping dewared couplings are required in the coolant feed in the base of the probe, with a dewared line going directly from there into the probehead, herein referring to the region in the probe containing the sample and sample coil.

This invention discloses a comparatively low-cost probe and method for multi-channel ULT NMR, with or without MAS, with or without DNP, that is compatible with high-field multinuclear triple resonance in both narrow-bore (NB) and wide-bore (WB) magnets. The most important key to this advance in ULT NMR probes is the incorporation of multiple compact counterflow heat exchangers into the probe, both in the body and in the base of the probe, that enable a novel cooling scheme. It will be seen that this makes the probe compatible with the standard helium recycling systems that one currently finds installed in many NMR labs (granted, with minor modifications and upgrades of those systems) rather than requiring an extremely expensive purpose-built closed-loop cryocooling system to carry out ULT NMR without burning through helium at an unacceptable rate. At the same time, it dramatically reduces the chances of ice blockages in the MAS stator by separating the coolant from the spin gases and enabling ULT MAS with RT spin gases entering the probe. (Ice blockages have been the death blow to at least several prior attempts toward enabling ULT MAS.) Supplying contaminant-free RT spin gases to the probe is much easier than supplying contaminant-free liquid cryogens or cold gases to the probe.

The NMR researcher's biggest concerns (possibly in order of importance) with a ULT NMR probe are: helium consumption (both liquid and gas), the required capital budget, laboratory space requirements, and breadth of functionality—high performance rf circuitry (at least H/X/Y, preferably H-F/X/Y/Z), DNP compatibility, and fast stable spinning over a wide temperature range. The inventive probe permits order-of-magnitude improvements in several of these issues compared to the prior art.

Relevant Prior-Art NMR Cryo-Probe Chronology

In U.S. Pat. No. 4,940,942 [1990], Bartuska discloses a method of providing variable temperature (VT) operation for the sample in an MAS probe that comprises directing a jet of cold VT gas over the central portion of a relatively long rotor while the gas bearings near the ends of the rotor are less cooled by warmer gas streams. This method (or a variant thereof) continues to be used in nearly all commercially available MAS probes except those by Doty Scientific Inc., often simply called Doty.

Doty produced and delivered several ULT MAS probes in the 1991-1995 period utilizing a spinner design similar to that disclosed in U.S. Pat. No. 4,456,882, but with bearing and drive gas feeds and manifolding more like what was used in Doty MAS probes for high-temperature operation, which utilized the spinner disclosed in U.S. Pat. No. 5,202,633. This ULT MAS probe was inverted relative to the standard NMR probe—i.e., it was inserted into the WB magnet from above. It included a pressurized 500 mL LHe reservoir above the spinner region and a metering valve below that which controlled the flow rate of the LHe into the gas manifold. A controlled heater below the metering valve vaporized the LHe before it entered the spinner assembly. With sufficient highly skilled attention, these probes permitted successful collection of ULT MAS NMR data at least down to 15 K with LHe usage rates in the 1.5-5 L/hr range. However, unavoidable ice particles generally made it impossible to maintain the desired control of the LHe metering over periods of more than 10-30 minutes, so the product was discontinued. This probe contained no counterflow heat exchangers.

In U.S. Pat. No. 5,508,619 Kotsubo & Black disclose several methods for conduction cooling of the coils of a high-resolution (HR) NMR probe for liquids. The coils are on substrates of high thermal conductivity that are conduction cooled by the heat sink on which they are mounted, which is cooled by a heat exchanger through which pressurized cold helium gas flows in a closed loop, as shown here in FIG. 1 Prior Art, taken from FIG. 2 in the referenced patent. These components are in an evacuated space for thermal isolation from the sample and the RT probe structure. The He gas is cooled by an external refrigerator. This method (or a variant thereof) continues to be a common method in HR NMR probes. This patent further illustrates how some efficient cryocoolers are commonly built to refrigerate the closed-loop, typically at pressures in the 10-25 bar range, by incorporating compact counterflow heat exchangers, which are external to the probe. The heat exchangers to the coil substrates are single streams through highly conductive blocks that are approximately isothermal, which by definition are not in the class of counterflow exchangers. This patent also discloses, in its FIG. 5 and attendant discussion, a method of cooling the substrate by the Joule-Thompson (JT) effect using high-pressure neon, as it has a high JT coefficient in the 28-40 K range at relevant pressures (though neon is quite expensive). As shown here in FIG. 2 Prior Art, taken from FIG. 5 of the referenced patent, they show that a counterflow exchanger in the base of the probe can be beneficial when cooling the sample coil in an HR NMR probe for liquids using the JT effect. However, these are clearly not ULT NMR probes as the samples are near RT.

Lipton, Ellis et al [Ellis 2001] report NMR ULT results in a static NMR probe that is of cryogenic design like those built by a number of other research groups over the past four decades. The probe is inserted from above the magnet into a commercially available continuous-flow cryostat (Oxford CF-1200, ~65 mm OD, 49 mm inside diameter, ID) designed to cool and maintain samples and associated apparatus in a helium gas atmosphere at temperatures down to 3.8 K when slightly sub-atmospheric. The helium coolant (liquid or gas) is vented into the cryostat below the sample and flows upward, bathing the sample, coil, and associated proximal components. The sample is cooled to near the vented gas temperature, as mean rf power deposited in the sample is typically well under 0.1 W.

In U.S. Pat. No. 7,141,979 Marek discloses an improvement on the single-loop method for cooling the sample coils in HR probes that consists of essentially doubling or tripling the single-loop method-using separate loops for the separate coils. Normally, it is more important from a S/N perspective to cool the "observe" or detection coil than the decoupling coil, but the decoupling coil is where most of the rf heating is deposited. By using separate coolant loops, it is easier to cool the observe coil to lower temperatures. Again, this is not a ULT probe as it does not have a cold sample, and it does not include counterflow exchangers, as such would be counter-productive for coil cooling.

In U.S. Pat. No. 7,151,374 Doty discloses an MAS probe, denoted OptiMAS, for use in NB magnets in which the various coils and capacitors required for triple resonance are housed in an insulated zone below the spinner region that can be cooled by a separate gas stream to reduce losses and noise contributed by these components. This probe, like hundreds of others we had made since 1985, was compatible with VT operation to below 100 K by cooling the bearing and drive spin gases, which were supplied to the sample spinner from the base of the probe through vacuum insulated transfer lines in the probe, as opposed to the Bartuska method that uses a separate gas line for VT directed at the center of the coil. The OptiMAS probe has been supplied to scores of customers over the years, with various sample spinners, such as described in U.S. Pat. Nos. 4,456,882, 5,508,615, and 7,170,292. The probe has also been operated on occasion with helium gas to ~50 K, but it contains no counterflow heat exchangers.

In U.S. Pat. No. 7,282,919 Doty discloses a probe, denoted CryoMAS-1 in which the rotor is thermally insulated from the coil region surrounding it by a thin ceramic vacuum jacket and the coils are conduction cooled to ~35 K by a cold finger cooled by a pressurized helium loop, somewhat like that seen in HR cryo-probes for liquids except that the coils in CryoMAS-1 were not in vacuum. Rather, they were in helium at above atmospheric pressure and thermally insulated by fibrous or similar insulating material. In this probe the MAS sample could be at any desired temperature from 35 K to 350 K while the coils were at 35 K. As in other cryo-probes, this probe contained no counterflow heat exchangers. It had several issues limiting its usability, some of which were improved upon in a subsequent patent, U.S. Pat. No. 7,915,893.

Barnes, Griffin et al [Griffin 2009] describe an MAS DNP probe for operation down to ~90 K that addresses some cryogenic issues by having a sealed probe body inside an evacuated outer vessel. As in Doty MAS probes, the spin gases establish the sample temperature and the temperature in the probehead. This probe included sample eject capability, not unlike that in Doty CryoMAS-1, though there are numerous other major differences. This probe has not been shown to be compatible with ULT, and it contained no counterflow heat exchangers.

Thurber, Tycko et al [Tycko, 2010] report EPR and 1H static NMR DNP at temperatures down to 7 K in a probe with some similarities to others for static ULT NMR of the past four decades in that it is inserted from above the magnet into a commercial cryostat. In this case, the sample and coil are conduction cooled by a helium-cooled copper block. A quasi-optical system below the magnet focuses a microwave beam through a window in the bottom of the cryostat onto the static sample. This probe contained no counterflow heat exchangers.

In U.S. Pat. No. 7,915,893 Shevgoor and Doty disclose a ULT probe, denoted CryoMAS-2, with several differences relative to CryoMAS-1, most notably in that the coils and capacitors are in high vacuum. That turned out to not be an improvement, as it was found to be impossible to prevent multipactor breakdown problems in a large vacuum space with numerous high-voltage surfaces in high external $B_0$. This problem arises because the electron paths in vacuum in high $B_0$ will impact the surfaces at low angles as they execute tight cyclotron orbits, and secondary electron yield at low incidence is greatly increased relative to normal incidence. This probe contained no counterflow heat exchangers.

Matsuki et al [Matsuki 2012] describe the first ULT MAS DNP probe that in its basic thermal design is similar to that in [Griffin 2009] except that the cold bearing and drive gases come from the cold gas above the liquid of an external pressurized helium cryostat containing a controlled helium boiler. Of course, there were various other differences, including that the microwaves come in from the top of the probe. They reported being able to spin a 3.2-mm rotor at 2.3 kHz at 30 K with LHe consumption of ~6 L/hr. This probe contained no counterflow heat exchangers.

Horri, Doty et al [Horri 2012] report successfully producing MAS-DNP results down to 87 K using a Doty WB MAS probe of essentially standard Doty production design with modifications for microwave irradiation via a waveguide coming in from above the probe, not unlike that seen in the Matsuki and [Tycko 2012] probes. A similar Doty MAS probe was used by Pike, Dupree et al [Dupree 2012] but with the microwaves beamed into the sample axially rather than transversely. It successfully produced MAS-DNP results at 14.1 T and ~90 K. These probes were not compatible with ULT and they contained no counterflow heat exchangers.

In U.S. Pat. No. 8,212,559 Armbruster and Knott disclose an improved method of rotor change in MAS-DNP probes that includes a transport that allows the rotor to be inserted into the base of the probe and transported up into the MAS spinner without removing the probe from the magnet or changing the inclination angle of the spinner. The patent also nicely provides an exceptionally clear overall description of various key features of the Bruker Biospin MAS-DNP probe. Like the Barnes/Griffin 2009 probe, this probe body is sealed from top to bottom and inside an evacuated full-length outer tube. As seen from the filing date, work on this began about the time of the [Griffin 2009] publication. Bruker Biospin began producing MAS-DNP probes for operation down to ~90 K based on this design not long thereafter. Many more details of the probehead region may be seen in the photo, drawing, and simulation results in the subsequent publication by (sadly, the late) Rosay and Engelke [Rosay 2015]. These probes were not compatible with ULT and they contained no counterflow heat exchangers.

Thurber, Tycko et al [Tycko 2013] report MAS DNP at 25 K in a probe using the Bartuska VT method of directing the cold helium coolant stream toward the center of the (long) rotor with cold nitrogen gas for the bearing and drive spin gases. They reported being able to spin a 3.2-mm rotor at 6.5 kHz at 25 K with LHe consumption of ~4 L/hr. This probe contained no counterflow heat exchangers.

Bouleau, De Paepe et al [De Paepe 2015] report initial work toward ULT MAS DNP using a modified 3.2-mm Bruker MAS DNP spinner for use in a substantially different and complex cryogenic system intended to be compatible with helium recycling. The schematics of this system presented in the subsequent review by Thankamony, Corzilius et al [Corzilius 2017] show three cold streams (drive, bearing, and VT) leaving the external cooling system and entering the base of probe, and a single cold exhaust gas line returning to the cryocooling system. The De Paepe 2015 publication also makes it quite clear that the three exhaust streams from the spinner (drive, bearing, and VT) are combined when they leave the spinner and sent as a single stream to the external cryogenic refrigeration/recycling system. Meaningful details on the spinner design, the cryogenics, the probe structure, and the system can hardly be deduced from known publications and the patent by Bouleau and De Paepe U.S. Pat. No. 10,209,329. Its claim 1 might seem to suggest there are exchangers in the probe, but the claim is clearly directed at the system, not the probe. The figures that include exchangers are all directed at the system (which includes at least one compressor that is clearly external to the probe) and they show no exchangers in the probe. The figures always show the exchangers in the external cryogenic refrigeration/recycling system, though in some places in the specification they are said to be between the probe and the refrigeration system. Some of the embodiments aim at recovering some of the refrigeration capacity of the spinner turbine expansion gas. However, the recuperator for that purpose is clearly shown (19 in FIGS. 3, 4, and 5 of U.S. Pat. No. 10,209,329) to be in the external cryogenic refrigeration/recycling system, not in the probe, which would defeat such an objective (because of unavoidable heat leaks, which the inventors ignore). While FIG. 6 in U.S. Pat. No. 10,209,329 could appear to show a counterflow exchanger in the same cryostat containing the probe, it also shows the cryocooler in that same cryostat, and it cannot be in the probe. Moreover, the probe is always identified as 9 in U.S. Pat. No. 10,209,329, and the exchanger 18 in FIG. 6 is shown external to the probe. The first decade of efforts by this group toward routine ULT MAS DNP do not yet appear to have been very productive. One can conclude from the publicly available documents that the De Paepe probes contained no counterflow heat exchangers.

Matsuki et al [Matsuki 2015] present a preliminary overview of their improved ULT MAS DNP probe and a purpose-built cryocooling system to permit closed-loop operation at least down to 30 K. Like their earlier version, the microwaves come in from the top and the probe is surrounded by an evacuated space over its full length. Three vacuum-insulated transfer lines (bearing, drive, and return) connect from the base of the probe to the external cryocooling system, which of course includes counterflow exchangers. Cool-down time is reported to be 6 hours, and stable 4 kHz spinning at 40 K was achieved for periods of several days. Stable spinning at temperatures down to 20 K was later reported. This basic design but with various changes (including bringing the microwaves in from the bottom) was commercialized by JEOL Resonance, and they delivered a probe and cryocooling system (which filled a room) to a customer in 2020. Again, the probe contained no counterflow heat exchangers.

Albert, Barnes et al [Albert 2017] describe a massive cryogenic system (that occupied multiple rooms) that reduced consumption of liquid nitrogen when operating their MAS-DNP probes at 85 K from several hundred liters per day to 90 L/day. Again, the Barnes probes contained no counterflow heat exchangers.

Arcon, Heinmaa, & Stern [Arcon 2018] report ULT MAS results from a cryoMAS probe by Ago Samoson's group that included a counterflow heat exchanger. Like the early Doty ULT MAS probes, this probe was inserted into the magnet from above, but in the Samoson probe the cold helium gas, supplied by a commercial continuous flow cryostat, flowed around the probehead shield then back up through a counterflow exchanger that provided the final cooling to the spin gases, as shown here in FIG. 3 Prior Art. This probe design, however, is not compatible with DNP. Moreover, since it comes in from the top, changing samples in it is quite laborious and time consuming.

Sesti, Barnes et al [Sesti 2018] report MAS results at 6 K in a probe that is in basic cryogenic and spinning respects similar to that reported in [Tycko 2012] except that this probe included sample eject capability, as in [Griffin 2009]. However, in this probe LHe consumption reportedly ranged from 35 to nearly 100 LHe/hr; and, like other probes using $N_2$ for the bearings, it is not compatible with any practical recycling scheme. The probe contained no counterflow heat exchangers.

In U.S. Pat. No. 10,712,298 Barnes discloses a concept for a frequency agile gyrotron, and he provides multiple views of sections of the spinner of a probe similar to that in [Barnes 2018]. He also presents several unrelated and unsupported ideas. One such idea (see his FIGS. 12A and 12B) is that the sample rotor, driven by $N_2$ gas, could include fins to circulate the cold VT helium that is cooling the rotor through a miniature undescribed heat exchanger near the spinner, with the exchanger cooled by a second closed refrigeration loop. Presumably that would not be a counterflow exchanger, as elsewhere the temperature difference along the rotor length is claimed to be miniscule.

SUMMARY OF THE INVENTION

An NMR probe for insertion into an NMR magnet from below is disclosed that includes multiple counterflow heat exchangers to enable a wide range of NMR methods at ultra low temperatures, including MAS DNP at temperatures below 15 K. Coolant fluid is ducted from the bottom of the probe through a vacuum insulated transfer line up into the probehead, the region containing the sample and sample coil, where it splits into first and second coolant streams for cooling first and second spin-gas streams, each through a cold counterflow exchanger and at least one cool counterflow exchanger contained within the probe.

The cold exchangers would each preferably comprise two straight continuously joined tubes inside a dewared tube that extends from a vacuum chamber in the base of the probe up into the probehead. These cold exchangers are denoted as Dual Inner Tube Exchangers (DITEs). The cool exchanger is preferably a coil of two parallel continuously thermally joined tubes, and it is denoted as a Parallel Tube Recuperator (PTR).

The first coolant-stream in the probehead feeds into the top of DITE-1, through which the first coolant stream flows downward, providing final cooling to the first spin gas stream which is flowing upward past it into the probehead. The first coolant stream leaving the bottom end of DITE-1 then enters the cooler end of a first PTR in an evacuated chamber in the base of the probe and proceeds through the first PTR to its warmer end in counter-current to the first spin gas stream which had entered at the warmer end of first PTR, exited at its cooler end, and proceeded into the bottom end of DITE-1. An additional PTR may be series connected to the first PTR to further improve the overall effectiveness of heat transfer from first spin gas stream to the first coolant stream.

In like manner, the second coolant stream cools a second spin gas stream.

The exchangers are designed to permit fast MAS at temperatures below 15 K when the probe is supplied with room-temperature helium spin gas streams at commonly used pressures and a helium coolant stream at less than 170 kPa from a standard portable helium cryostat. Liquid helium usage rate is typically in the 2-12 L/hr range, depending on the spinning rate and sample temperature. Both the spin gases and the coolant fluid are fully recoverable without contamination for recycling using the standard helium recycling methods and equipment (with minor upgrades) commonly found in many NMR laboratories.

DETAILED DESCRIPTION

Figure 1:
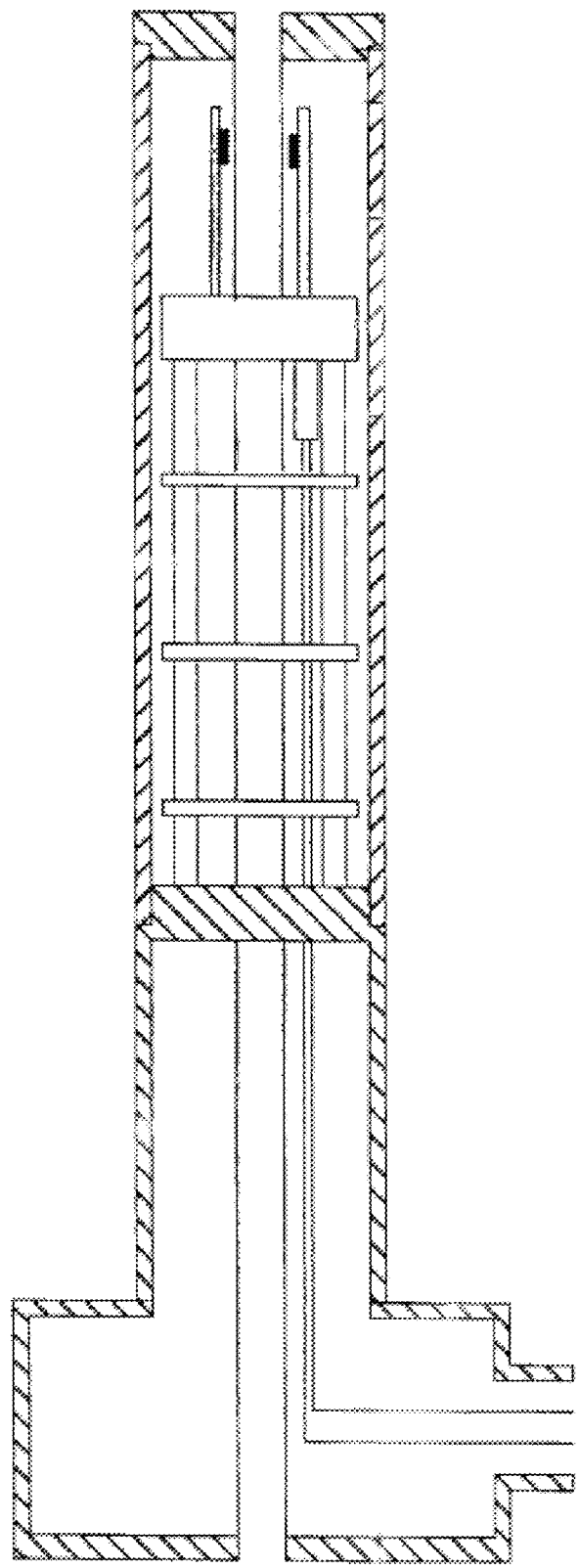
FIG. 1A Prior Art coil-cooling method for liquids NMR using cold helium gas.
Figure 2:
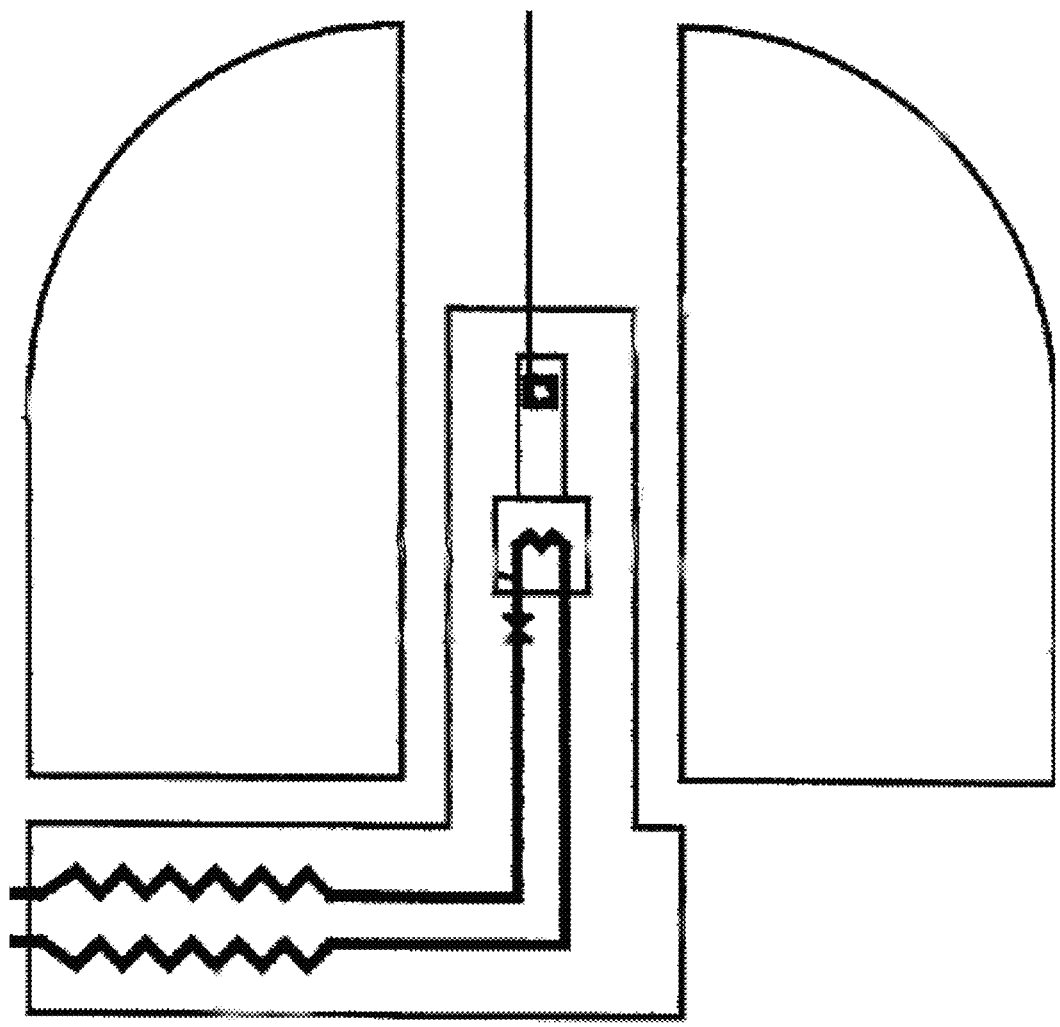
FIG. 2A Prior Art coil-cooling method for liquids NMR using the JT effect with neon.
Figure 3:
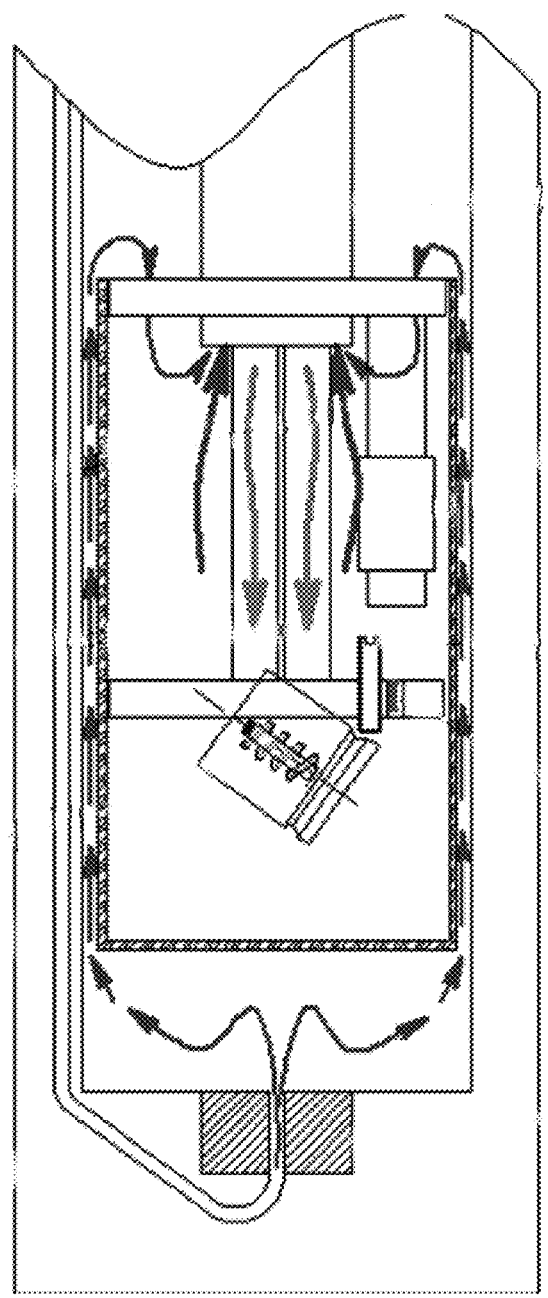
FIG. 3 Prior Art ULT MAS probehead by Ago Samoson.
Figure 4:
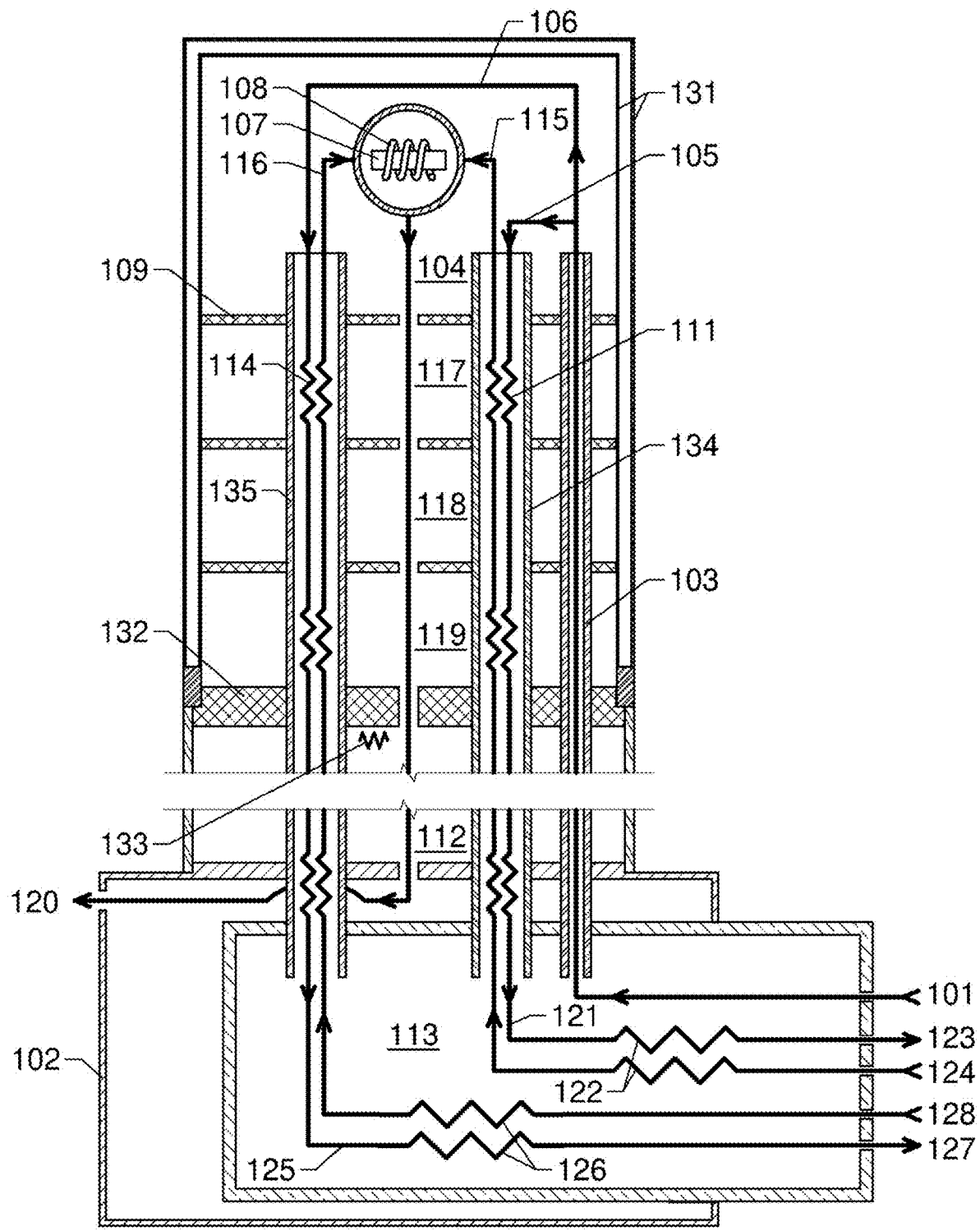
FIG. 4 depicts the basic cryogenic elements and flows in the ULT MAS probe.

FIG. 4 presents a schematic depiction of the basic cryogenic elements in a representative ULT NMR MAS probe (instrument) for insertion into an NMR magnet from below its center of field. Coolant fluid 101 enters though a suitable low-heat-leak connection according to the prior art in the base 102 of the probe and is ducted upward through the probe in a vacuum jacketed coolant dewar 103 into the probehead 104 where it splits into cold bearing coolant 105 (alternatively called cold-coolant-stream-1) and cold drive coolant 106 (alternatively called cold-coolant-stream-2). For clarification, probehead herein refers to the region containing the sample 107 and sample coil 108. Upper circuit board 109 is below the sample region.

Cold bearing coolant 105 enters the top (probehead end) of first dewared counterflow cold exchanger 111 which extends downwards through the probe body 112 into a vacuum chamber 113 in the probe base 102. Cold drive coolant 106 enters the top of second dewared counterflow cold exchanger 114 which extends downwards into vacuum chamber 113.

These cold exchangers could, for example, be of the conventional concentric double-pipe type, comprising a tube for one of the gas streams inside a dewar (vacuum jacketed line) with the other gas stream flowing in counter-current around it. The preferred alternative that simplifies plumbing connections comprises two straight continuously thermally joined tubes, such as by solder, inside a dewared tube. These double-walled vacuum-insulated tubes according to the prior art are indicated by 134 and 135 for the bearing and drive respectively. Exchangers of this preferred type are herein denoted as Dual Inner Tube Exchangers (DITEs). In either case, the dewared counterflow cold exchangers extend from the vacuum chamber 113 in the base of the probe up to the probehead 104. The cold exchangers, hereinafter often non-restrictively referred to as DITEs, are closed at one end to prevent spin gas exhaust from the probe head flowing into vacuum chamber 113.

DITE-1 111 provides final cooling to cold bearing gas 115 as it flows upward through it into the probehead. DITE-2 114 provides final cooling to cold drive gas 116 as it flows upward through it into the probehead. Cold bearing gas may alternatively be called first cold spin gas stream. Cold drive gas may alternatively be called second cold spin gas stream.

Probe rf sections 117, 118, and 119 between the probehead 104 and body 112 may contain tuning coils and capacitors for tuning and matching the sample coil to multiple frequencies, according to the prior art. There may be more or fewer than the three rf sections shown here. Having more rf sections is preferred, as the circuit boards or baffles between sections also serve to suppress convection and thereby confine the high thermal gradients to the lowest rf region and minimize the thermal gradients in the probehead. The spin gases exhaust from the probehead 104 downward through the rf sections and body, which are all normally slightly above atmospheric pressure at various temperatures, and the spin gases exit at warmed spin gas exhaust 120.

Cool bearing coolant 121 leaving the bottom end of DITE-1 111 then enters the cooler end of first cool counterflow exchanger 122 in vacuum chamber 113 in the probe base. While the cool counterflow exchangers may be of the conventional double-pipe type, the preferred type is a coil of two parallel continuously thermally joined tubes. It is herein denoted as a Parallel Tube Recuperator (PTR, though a more correct moniker would be Anti-Parallel Exchanger, as the flows are counter current and it is not strictly a recuperator by some definitions). Cool bearing coolant 121 proceeds through first cool counterflow exchanger 122 and exits at warmed bearing coolant exhaust 123, in counter-current to entering warm bearing gas 124.

Cool drive coolant 125 leaving the bottom end of DITE-2 114 then enters the cooler end of second cool counterflow exchanger 126 in vacuum chamber 113 in the probe base. Cool drive coolant 125 proceeds through second cool counterflow exchanger 126 and exits at warmed drive exhaust 127, in counter-current to entering warm drive gas 128.

A dewared shield 131 encloses the probehead 104 and rf sections 117, 118, 119. The shield 131 is normally sealed to bulkhead 132 between body 112 and the adjacent rf section 119 with an o-ring. Obviously, the spin gases and the coolant fluid must be helium for satisfactory operation below ~85 K. As helium is expensive it is highly desirable to be able to recycle it, and to that end it is desirable to minimize contamination of the exhaust gases. As will be seen in a later figure, several protrusions are required through the base and the bulkhead for adjustments of the rf turning circuit, so it is beneficial to seal around these. A heater 133 is mounted on the bulkhead so its temperature may be kept above that needed, typically ~260 K, for elastomeric o-rings to seal adequately. This deliberate heating of the exhaust spin gases is counter to that seen in the prior art. However, not attempting to utilize the (relatively minor) cooling capacity of the spin gas exhaust permits a substantial reduction in system cost and therefore in total amortized operating costs.

FIG. 4 presented the basic cryogenic elements and flows in a ULT NMR MAS probe, where normally two spin-gas streams are needed, one for bearing and one for drive, and this is the more frequently seen application. However, as noted in the background section, there are also important applications, commonly called wide-line (WL) NMR, where MAS is of little or no value. Such experiments may be performed in an MAS probe with the rotor prevented from spinning, though improved S/N is obtained in a probe with a solenoidal sample coil with its axis transverse to $B_0$ rather than at the magic angle. In such a non-spinning probe, a single gas stream is sufficient to achieve the desired cooling of the sample and sample coil.

Figure 5:
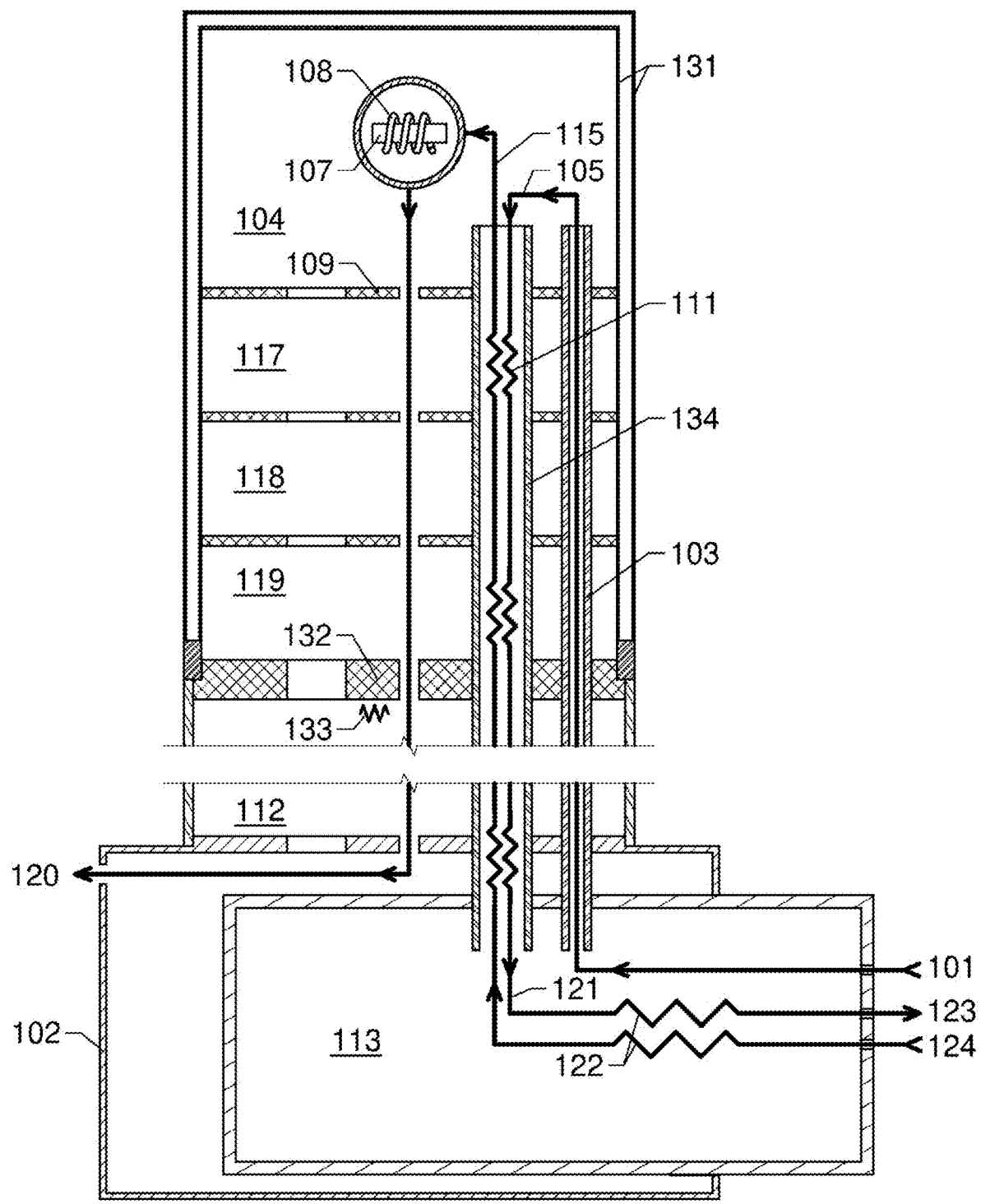
FIG. 5 depicts the basic cryogenic elements and flows in the ULT WL probe.

The basic cryogenic elements and flows for a non-spinning ULT wide-line NMR probe are shown in FIG. 5. Clearly, it looks very much like FIG. 4 but without the split in the source coolant flow into two streams and the need for two DITE's and two PTRs.

Coolant fluid 101 enters though a suitable low-heat-leak connection according to the prior art in the base 102 of the probe and is ducted upward through probe coolant dewar 103 into the probehead 104, as in the ULT MAS probe.

Cold bearing coolant 105 enters the top (probehead end) of DITE-1 111, which extends downward through the probe body 112 into vacuum chamber 113.

DITE-1 111 provides final cooling to cold bearing gas 115 as it flows upward through it into the probehead. Cold bearing gas may alternatively be called cold VT gas stream or first cold spin gas stream for generality, though the sample in the WL probe doesn't spin. The cold bearing gas 115 is directed over the sample and sample coil, and then flows downward through the rf sections and exits at warmed spin gas exhaust 120, which may alternatively be called warmed VT gas exhaust.

Cool bearing coolant 121 leaving the bottom end of DITE-1 111 then enters the cooler end of cool counterflow exchanger 122 in vacuum chamber 113 in the probe base. Cool bearing coolant 121 proceeds through cool counterflow exchanger 122 and exits at warmed bearing exhaust 123, in counter-current to entering warm bearing gas 124, which may alternatively be called warm VT gas.

Figure 6:
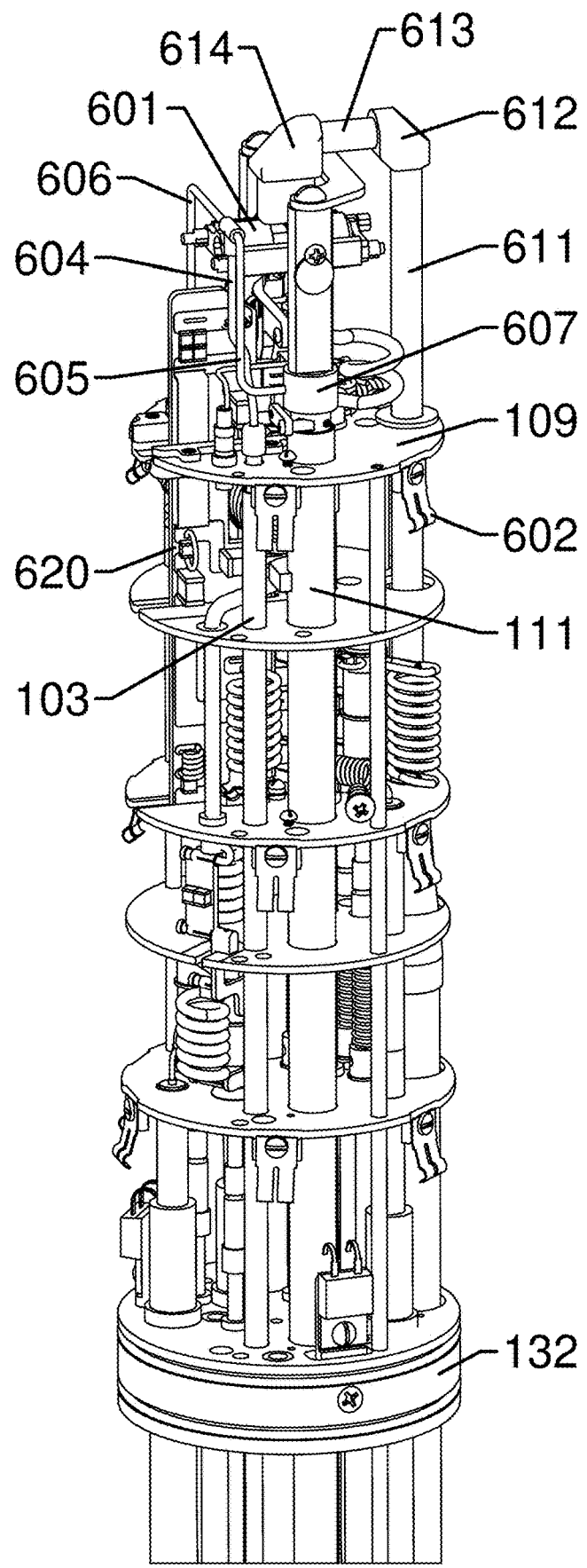
FIG. 6 is an upper front right perspective view of the top of a ULT WL DNP probe.

FIG. 6 is a front right upper perspective view of the top portion of a complete model of a quadruple-resonance multi-nuclear (commonly denoted H/X/Y/Z) ULT WL DNP probe with some components hidden for better viewing of crucial inventive components. The rf circuit is essentially as previously presented by the inventor [Doty 2019], and will not be discussed here in detail, as it is prior art and has little relevance to thermal matters. The specific embodiment shown here is a ULT WL DNP probe that could easily be converted to a ULT MAS DNP probe by changing the coil module to a spinner module and enabling a second DITE and its associated PTR(s), as will be seen. Note that the second DITE connections in the probehead are already present in FIG. 6.

A brass disc is preferably used for upper circuit board 109 for structural, electrical, and thermal reasons, so it may alternatively (perhaps preferably) be called the upper ground plane. As in the prior art [Doty 2019], circuit nodes at potentials other than ground and requiring mechanical support are mounted on small dielectric isolators on such circuit boards. The prior art sample coil module 601 supports the sample coil and sample cell, as for example in Doty WL NMR probes for the past four decades, and possibly a microwave reflector, as in [Rosay 2016].

The cold spin (or VT) gas exhausts from the sample coil module and produces turbulence in the probehead, enhancing heat transfer from all surfaces, most of which are metal or ceramic, and particularly to ground plane 109 as the spin gas exhausts downward through the small clearance space between circuit board and dewared shield 131 (hidden in this view) and through various openings in ground plane 109. Ground fingers 602 on the ground plane serve not only the essential electrical function of keeping the shield 131 at the same ground potential as ground plane 109, but also enhance cooling of the shield, as thermal conduction of the inner wall of 131 to heated bulkhead 132 otherwise may significantly warm the inner wall of the shield in the probehead region. The crucial circuit components associated with the high frequency (HF) resonance ($^1$H or $^{19}$F) are above the upper ground plane, some of which can be seen in this view.

Coolant dewar 103 terminates near ground plane 109, and coolant line 604 continues upward from it into probehead 104. Coolant dewar 103 may terminate below ground plane 109 in adjacent rf section 117 as shown without significant cooling detriment, as the temperature difference between rf section 117 and probehead 104 is small. Coolant line 604 may be thermally joined to ground plane 109 as shown to augment cooling of ground plane 109.

Coolant line 604 is seen continuing up to where it splits into cold bearing coolant line 605 and cold drive coolant line 606, which respectively duct cold bearing coolant 105 and cold drive coolant 106 as was seen in FIG. 4. While stream 106 is not needed for the ULT WL DNP probe shown here in FIG. 6, it is included in this figure to illustrate how it may be implemented in the ULT MAS DNP version. Cold bearing coolant line 605 is seen entering near the bottom of bearing gas post 607, which ducts cold bearing coolant 105 downward into a tube in the top of DITE-1 111 and ducts cold bearing gas upward, ultimately into sample coil module 601, as in the prior art.

Overmoded waveguide 611 guides microwave irradiation from below upward to a first upper miter bend 612 behind sample coil module 601. Upper transverse overmoded waveguide 613 guides microwave radiation to a second miter bend 614 above module 601. Second upper miter bend 614 directs the microwaves downward toward the sample.

Preferably, the coils and capacitors for tuning the sample coil 108 to multiple frequencies are mostly located on vertical circuit card insert 620 that slides in and connects appropriately to the variable capacitors needed for fine tuning that are located on the various circuit boards. They may be adjustable from knobs on the base of the probe, as in the prior art. Heated bulkhead 132 is seen below the lowest rf section.

Figure 7:
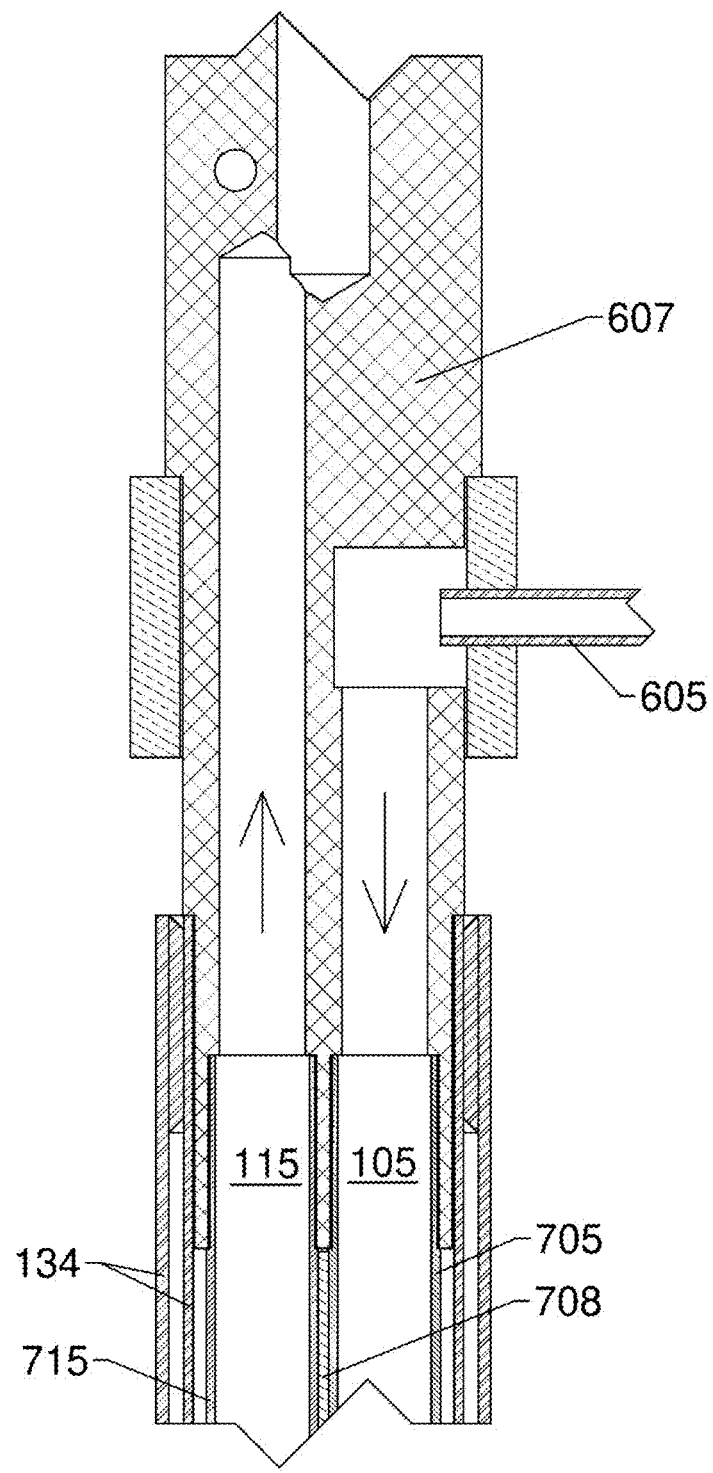
FIG. 7 is a cross-section through the top of a Dual Inner Tube Exchanger (DITE).

More details of how the stream connections in the top of DITE-1 111 to gas post 607 may be implemented can be seen in cross-section in FIG. 7. Cold bearing coolant line 605 connects to the top of coolant tube 705 which ducts cold bearing coolant 105 downward for final cooling of cold bearing gas 115 (alternatively called cold VT gas) that is flowing upward in bearing gas tube 715. Tubes 705 and 715 are joined by thermally conducting material 708, such as solder, over most of their lengths. Bearing gas tube 715 connects into a hole in gas post 607 that ducts bearing gas upward, ultimately into sample coil module 601. The two tubes are seen to be inside a vacuum-jacketed dewar line 134, and the tubes need not be of the same diameter.

Figure 8:
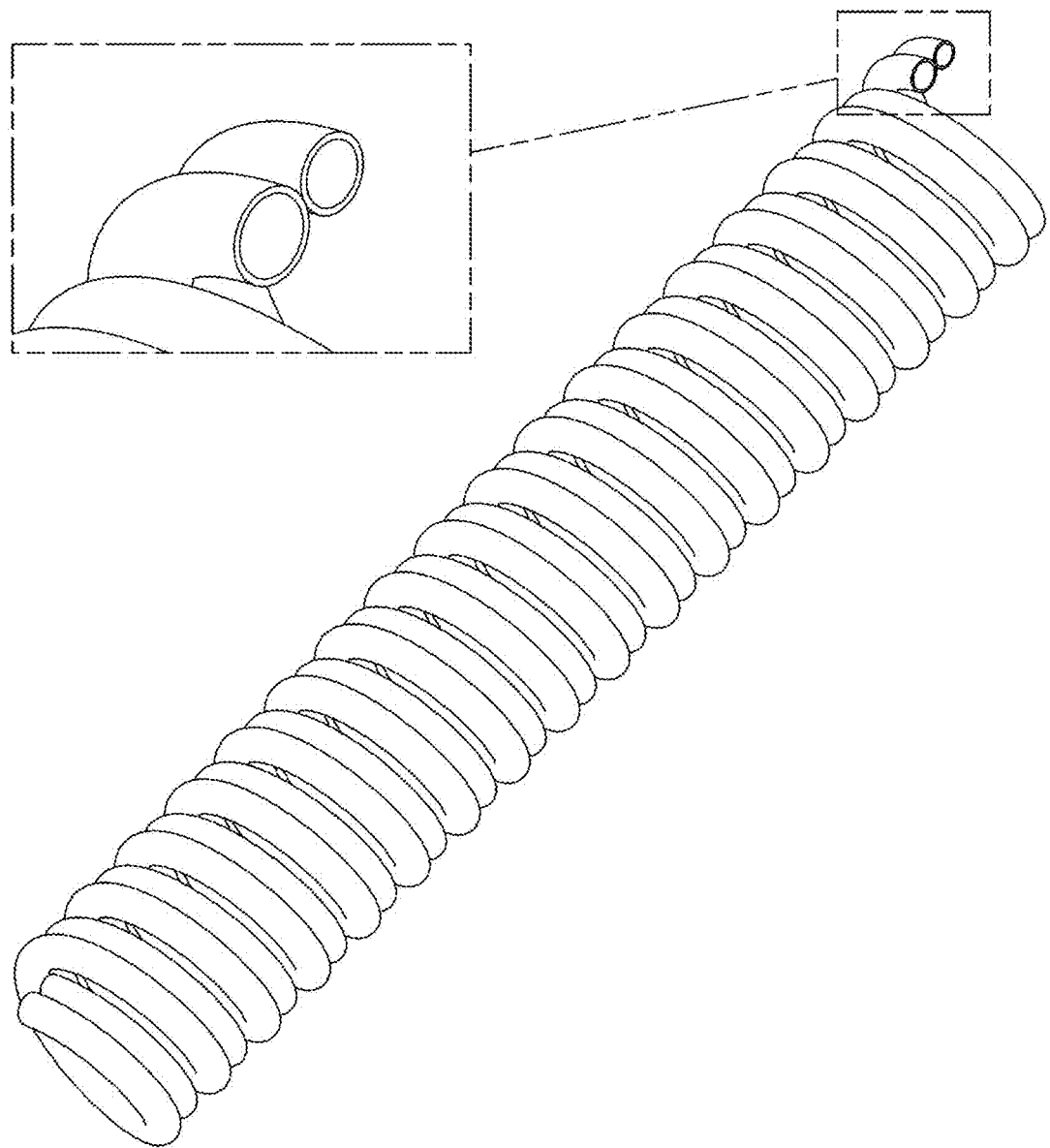
FIG. 8 is a perspective view of a coiled Parallel Tube Recuperator (PTR).

FIG. 8 is a perspective view of a portion of a coiled Parallel Tube Recuperator (PTR), a coil of two thermally joined tubes, typically of copper or a copper alloy. The tubes may be thermally joined by laser welding or by solder along at least most of their lengths, though perhaps only in spots. As seen here, the tubes need not be the same size. The tubes are then gold plated for low absorption of infrared radiation. The PTR embodiment has several distinct advantages compared to the classic double-pipe embodiment in compact cryogenic helium applications. It also has advantages over other commonly encountered designs of compact cryogenic exchangers that need not be reviewed here. The outer tube of the double-pipe exchanger must be large enough to encase the inner tube and provide adequate shell-side flow space. Hence, it must have outside diameter (OD) substantially larger than that of the inner tube. The large OD of the larger tube limits the minimum diameter to which the double-pipe can readily be coiled. For similar backpressure of the lower-pressure stream, the PTR can readily be coiled to a smaller diameter than the double-pipe, and thus it permits higher effectiveness in a small vacuum chamber. The PTR also permits substantial simplifications in making the needed leak-tight connections to both streams at the ends. The PTR is fundamentally very similar to the multi-channel tubular extrusions commonly seen in cryo-refrigerators, but they present more complications in making the needed leak-tight connections at the ends and require custom extrusions. The PTR tubing will typically have ID in the 3-4.2 mm range, but tubing ID may be as small as 2 mm or as large as 7 mm.

Figure 9:
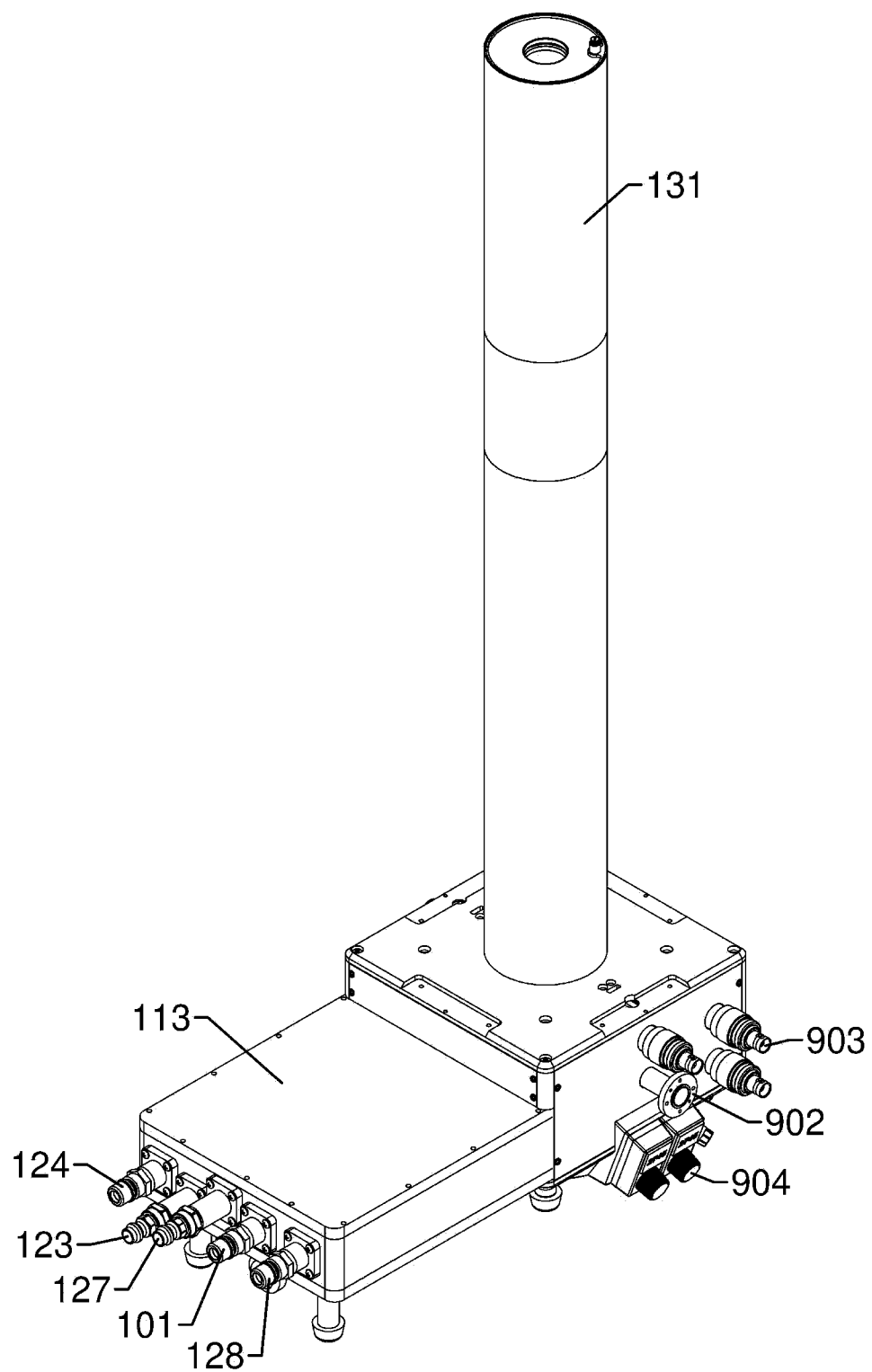
FIG. 9 is a perspective external view of a complete ULT MAS DNP probe.

FIG. 9 is a perspective external view of a complete ULT MAS DNP probe. The dewared shield 131 insulates the probehead and upper rf regions. The vacuum chamber 113 houses the PTRs. Microwaves are fed in at flange 902 that connects to an overmoded transverse waveguide followed by a miter bend to a vertical waveguide for transmission up to waveguide 611 in the probehead. RF connector 903 is one of the three rf connectors visible in this view. Knob 904 is one of the two adjustment knobs visible in this view for adjustment of variable capacitors. Five fluid connectors are seen on the front side of the vacuum chamber—coolant fluid inlet 101, warmed bearing coolant exhaust 123, warm bearing gas inlet 124, warmed drive coolant exhaust 127, and warm drive gas inlet 128.

Figure 10:
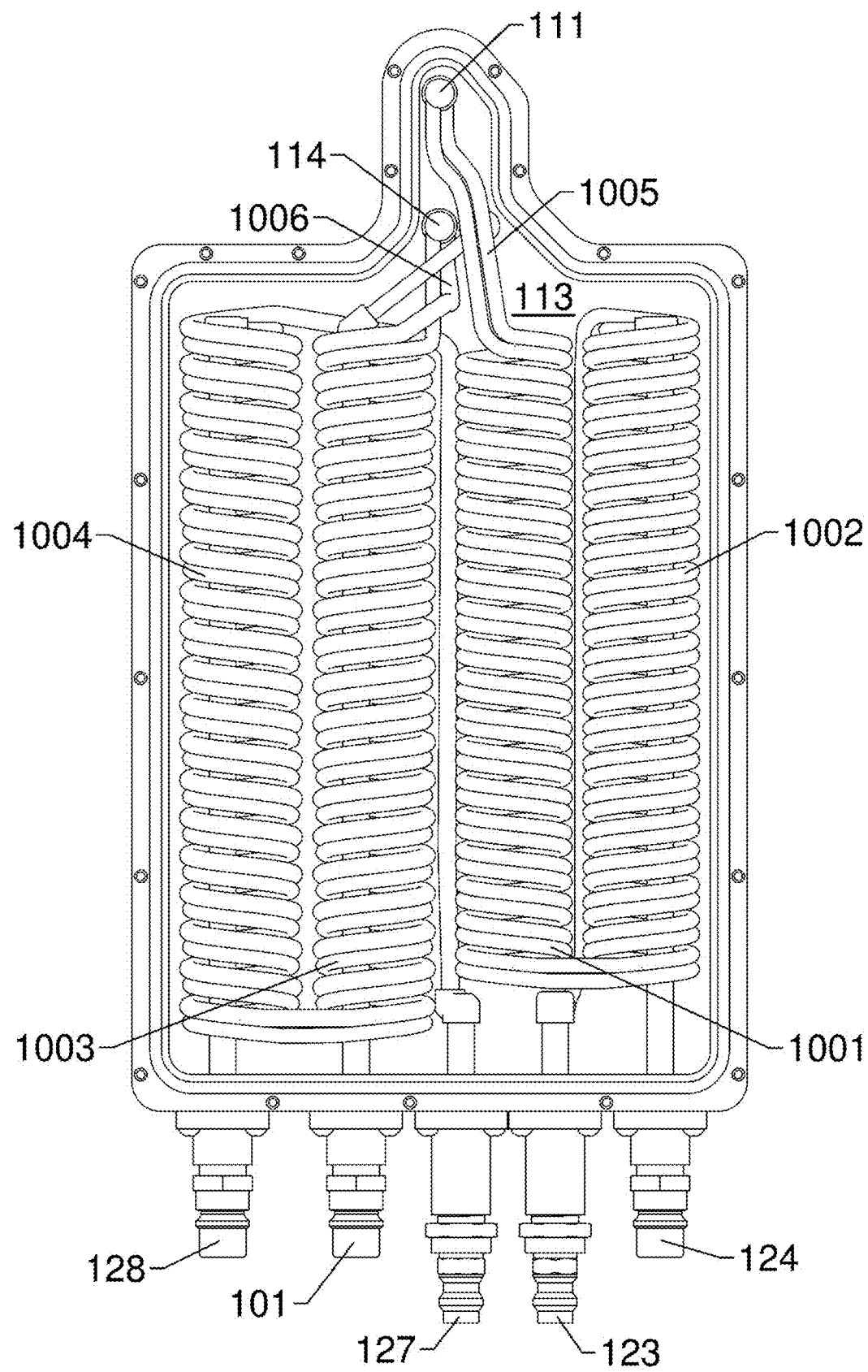
FIG. 10 is a bottom view of the vacuum chamber and PTRs.

FIG. 10 is a bottom view showing primary components in the vacuum chamber 113 and external fluid couplings. The five fluid couplings are seen on the front side of the vacuum chamber—coolant fluid inlet 101, warmed bearing coolant exhaust 123, warm bearing gas inlet 124, warmed drive coolant exhaust 127, and warm drive gas inlet 128. Two series-connected PTRs are used for both the bearing cool exchanger 122 and the drive cool exchanger 126. More specifically, bearing cool exchanger 122 is shown comprised of PTR-B1 1001 series connected to PTR-B2 1002. Drive cool exchanger 126 is shown comprised of PTR-D1 1003 series connected to PTR-D2 1004. The bottoms of bearing DITE-1 111 and drive DITE-2 114 can also be seen. Tube 1005 ducts cool bearing coolant 121 from the bottom end of DITE-1 111 into the cooler end of PTR-B1 1001. Tube 1006 ducts cool drive coolant 125 from the bottom end of DITE-2 114 into the cooler end of PTR-D1 1003.

As in the prior art, there will be temperature sensors at various locations in the probehead, the probe base, and the body for monitoring and control, and the spin gas lines in the DITEs will contain heaters for fine control of the spin gas temperatures. While separation of the coolant from the spin gases reduces the chances of an ice blockage developing in the spinner, they can still develop. If an ice blockage develops it can be more easily cleared than in alternative ULT probe designs by stopping the cryogen flow and applying power to the heaters in the DITEs.

Figure 11:
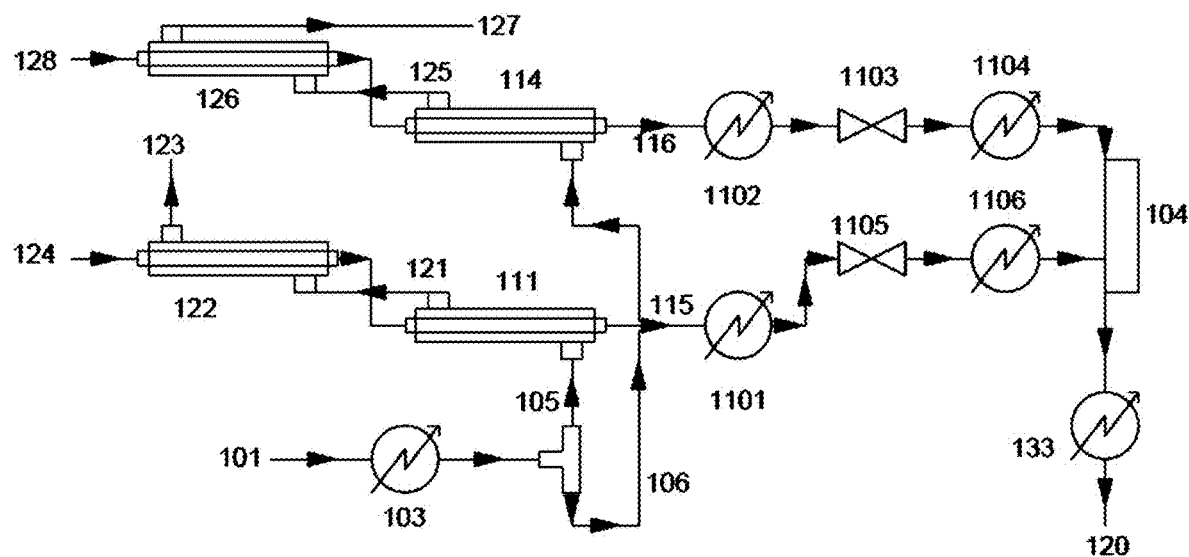
FIG. 11 is a process flow diagram of the thermal processes in the ULT MAS probe.

FIG. 11 is a process flow diagram using common symbols for the primary thermal exchanges and flow processes in the ULT MAS probe (with or without DNP) for simulation using commercially available process flow simulation software, such as Aspen Plus or Design-II for Windows. Specifically, the latter was used to simulate various ULT probe operating cases, several of which are presented as examples.

In these examples, the DITEs were 0.45 m long, the DITE coolant Cu tube had effective mean inside diameter (ID) 2.4 mm. The spin-gas Cu tube was somewhat larger but also contained a ceramic heater over most of its length, leaving an effective mean flow ID of about 2.5 mm. The series connected PTRs (PTR-B1, PTR-B2, PTR-D1, PTR-D2) each had 1.44-m tubing lengths. The PTR spin-gas Cu tubes had 3.26 mm ID. The PTR drive coolant tubes had 4.02 mm ID, and the PTR bearing coolant tubes had 3.26 mm ID.

The counterflow exchangers are modeled in the simulation software with appropriate characteristics, as calculated from standard NTU (number of transfer units) theory. Pressure drops were calculated by standard methods for Reynolds numbers in the 3000-12,000 range (mildly turbulent flow) with increased friction factors f, typically ~0.04, as seen experimentally for cryogenic helium flows in similar coils at moderately high Stanton number. Nusselt numbers, from experimentally adjusted correlations, were typically in the 20-45 range. Small appropriate heat leaks were included in the models.

In these examples, drive gas enters at 128 at RT, bearing gas enters in stream 124 at RT, both of which are seen on the left side of the diagram, and coolant fluid enters in stream 101, as seen near bottom left of the diagram. The common double-pipe symbol is used to represent the PTRs and the DITEs. Drive PTR 126 is the series combination of PTR-D1 1003 and PTR-D2 1004. Bearing PTR 122 is the series combination of PTR-B1 1001 and PTR-B2 1002.

The small heat and pressure losses in coolant inlet coupling and dewar 103 are captured by modeling it as an exchanger as shown with appropriate losses specified, typically 3 W and 2 kPa. The stream leaving it in the probehead splits into cold bearing coolant 105 and cold drive coolant 106, which enter the tops of bearing DITE-1 111 and drive DITE-2 114 respectively. Cool bearing coolant stream 121 leaves the bottom of bearing DITE-1 111 and enters the cool end of bearing PTR 122. Cool drive coolant stream 125 leaves the bottom of drive DITE-2 114 and enters the cool end of drive PTR 126.

The small heat losses in cold bearing gas 115 and cold drive gas 116 are captured in exchangers 1101 and 1102 respectively with appropriate losses specified, typically about 1 W each if at similar temperatures. The drive gas expands (to near atmospheric pressure) through drive jets 1103 and does work on the rotor drive turbine cap, which further cools the drive exhaust stream. That cooling is captured by applying appropriate negative power in turbine exchanger 1104, which is typically about 1 W for fast spinning of small rotors at ULT but can range from 0.1-50 W, depending on rotor size, speed, and temperature. The bearing gas expands (to near atmospheric pressure) through bearing orifices 1105 and is heated by bearing friction of magnitude similar to the turbine power, which warms the rotor and the bearing exhaust stream. That warming is captured by applying appropriate positive power in friction exchanger 1106. The spin gases exhaust into the probehead 104 and flow downward through the rf sections. They are heated by bulkhead heater 133 to near RT before exhausting from the probe body in stream 120 typically at about 5 kPa above atmospheric pressure for compatibility with standard helium recycling systems.

Coolant exhausts from bearing PTR 122 in stream 123, and coolant exhausts from drive PTR 126 in stream 127. The counterflow exchangers were all modeled as UA exchangers with specified heat transfer coefficient U [W/m²/K], area A [m2], "tube-side" pressure drop $\delta p_t$ [kPa], and "shell-side" pressure drop $\delta p_s$ [kPa]. (The customary designators "tube-side" and "shell-side" will be used for convenience, though "stream-1" and "stream-2" would be more accurate designators in PTRs and DITEs.)

The desired mass flow rate of drive gas for MAS is typically 2-4 times the desired mass flow rate of bearing gas. The desired ratio of drive to bearing coolant flows would generally be similar to achieve similar temperatures in these streams when they enter the spinner module 601. As noted earlier, the coolant tubes in PTR-D1 and PTR-D2 are larger than the coolant tubes in PTR-B1 and PTR-B2 in these examples. That will result in greater drive coolant flow than bearing coolant flow if no other restrictions are applied and both bearing coolant outlet 123 and drive coolant outlet 127 are exhausting into the same pressure. With separate outlets 123 and 127 on the base of the probe, as shown, additional control over the coolant split ratio can be obtained by adding some additional controlled constriction in either stream downstream after leaving the base of the probe.

The bearing and drive coolant outlets could be combined prior to leaving the vacuum chamber into a single line and outlet coupling, at either 123 or 127, in which case two coolant outlet couplings would not be needed. With a single coolant outlet, it would not be possible to optimize the coolant split ratio between the two streams by separate external backpressure control, but that may be a desired tradeoff in some cases.

When helium coolant is used, the coolant streams would preferably be recycled. For that, they would need to exhaust with minimal air contamination and at about 10 kPa above atmospheric pressure for compatibility with external heating to near RT followed by collection by standard helium recycling methods.

Simulation results for three helium cases followed by one nitrogen case are presented below. The temperatures shown for coolant inlet 101 are at the coupling in the probe base, after the 4-6 W heating experienced in transfer from a standard liquid cryogen cryostat to the probe base. The helium coolant in the first three cases is 100% gas phase when it gets to the probe. The nitrogen coolant in the last case is still about 97% liquid phase when it enters the coolant dewar 103. The first two cases are with a 1.3-mm rotor. The last two cases are with a 3-mm rotor. Coolant stream flows in the examples are shown in the tables in units of g/s, from which liquid cryogen consumption in other common units are easily calculated to be approximately: in example 1 (15-K fast-MAS), 9.8 LHe/hr; in example 2 (35-K slow-MAS), 2.2 LHe/hr; in example 3 (14-K WL), 2.9 LHe/hr; and in example 4 (95-K fast-MAS), 3.9 L/hr of liquid nitrogen. Heat leaks may be higher and exchanger effectiveness may be lower than assumed in these simulations, and thus more coolant flow may be required than projected for the spin-gas flow rates shown here. Lower temperatures in the helium cases can be reached by increasing the coolant flow. For example, a sample temperature of 8 K for the WL case is expected at about 5 LHe/hr.

| Example 1, Fast-MAS, 1.3 mm, 15 K, Helium | | | | |
|---|---|---|---|---|
| Stream | Ref # | T, K | p, kPa | flow, g/s |
| Bearing gas in | 124 | 295 | 475 | 0.1 |
| Drive gas in | 128 | 295 | 445 | 0.2 |
| Coolant in | 101 | 4.6 | 135 | 0.34 |
| Spinner bearing in | 115 | 13 | 440 | 0.1 |
| Spinner drive in | 116 | 15 | 460 | 0.2 |
| Bearing coolant out | 123 | 249 | 114 | 0.12 |
| Drive coolant out | 127 | 254 | 109 | 0.22 |

| Example 2, Slow-MAS, 1.3 mm, 35 K, Helium | | | | |
|---|---|---|---|---|
| Stream | Ref # | T, K | p, kPa | flow, g/s |
| Bearing gas in | 124 | 295 | 195 | 0.028 |
| Drive gas in | 128 | 295 | 195 | 0.048 |
| Coolant in | 101 | 9 | 125 | 0.075 |
| Spinner bearing in | 115 | 33 | 190 | 0.028 |
| Spinner drive in | 116 | 35 | 188 | 0.048 |
| Bearing coolant out | 123 | 291 | 112 | 0.027 |
| Drive coolant out | 127 | 294 | 111 | 0.048 |

| Example 3, Wide-line, 3 mm, 14 K, Helium | | | | |
|---|---|---|---|---|
| Stream | Ref # | T, K | p, kPa | flow, g/s |
| Bearing gas in | 124 | 300 | 120 | 0.03 |
| Drive gas in | 128 | — | — | 0 |
| Coolant in | 101 | 7 | 125 | 0.1 |
| Spinner bearing in | 115 | 11 | 119 | 0.03 |
| Spinner drive in | 116 | — | — | 0 |
| Bearing coolant out | 123 | 98 | 121 | 0.1 |
| Drive coolant out | 127 | — | — | 0 |

| Example 4, Fast-MAS, 3 mm, 95 K, Nitrogen | | | | |
|---|---|---|---|---|
| Stream | Ref # | T, K | p, kPa | flow, g/s |
| Bearing gas in | 124 | 295 | 450 | 0.52 |
| Drive gas in | 128 | 295 | 480 | 0.97 |
| Coolant in | 101 | 79.4 | 128 | 0.85 |
| Spinner bearing in | 115 | 96 | 430 | 0.52 |
| Spinner drive in | 116 | 105 | 435 | 0.97 |
| Bearing coolant out | 123 | 291 | 117 | 0.31 |
| Drive coolant out | 127 | 294 | 109 | 0.54 |

As noted earlier but is worth repeating, the liquid and gaseous helium usage in the inventive ULT probe need not be consumption, as the probe is compatible with standard helium recycling methods and equipment, though possibly requiring a recycling capacity upgrade and other system modifications that are minor compared to the cost and lab space requirements of a purpose-built helium recycling system for a ULT NMR probe.

The specific ULT probe embodiments presented thus far, for example in FIGS. 6, 9, 10, and 12, have been of a probe for use in wide bore (WB) magnets, where the ID of the RT shim system is typically ~73 mm. All known MAS-DNP probes thus far have been for use in WB magnets. However, there are probably at least 20 times as many narrow-bore (NB, alternatively known as standard bore, SB) magnets in use as high-field WB magnets, so it is important that MAS-DNP probes also become available for NB magnets. In [Doty 2019] the inventor shows how a high-field H/X/Y/Z MAS NB probe with a wide operating temperature range can be made with some features similar to some of those seen in the inventive ULT probe, including a dewared shield, thin dewared lines for the bearing and drive gases, multiple metal circuit boards on which variable capacitors are mounted, and most of the fixed circuit tuning elements on a plug-in card.

Clearly, making room even in a triple-resonance multinuclear NB MAS probe for the waveguide needed for DNP and the coolant dewar needed to supply coolant to the tops of the DITEs needed for ULT would impose more limits on rf tuning options and would require various other changes. The DITEs in the WB ULT embodiment illustrated had 9.52 mm OD. Reducing that to the 7.94 mm OD of the dewared lines used for bearing and drive gas in the referenced NB probe without causing an unacceptable increase in pressure drops, while challenging, should be possible, or somewhat larger DITEs could be accommodated with other changes. The inventor in a recent pending PCT discloses how the diameter of overmoded THz waveguides can be made much smaller than previously thought possibly without significant increase in losses.

The specific rf circuit embodiments referenced thus far are complex and challenging examples. Obviously, simpler rf circuits may also be chosen for specific purposes, such as $^1$H only, or $^1$H/X, or X-only, or numerous other known circuits, including $^1$H/$^{19}$F/X/Y. The specific embodiments presented thus far also show the dewared shield 131 not extending to the probe base 102, as has been seen in most of the published MAS-DNP probe designs. These and other embodiments are included in the scope of the following claims.

REFERENCES

1. Bartuska V J, "Method and Apparatus for Conduction Variable-Temperature Solid State Magnetic Resonance Spectroscopy", U.S. Pat. No. 4,940,942, 1990.
2. Kotsubo V and Black R D, "Apparatus for cooling NMR coils", U.S. Pat. No. 5,508,613, 1996.
3. Lipton A S, Sears J A, and Ellis P D, "A General Strategy for the NMR Observation of half-integer Quadrupolar Nuclei in Dilute Environments", J. Magn. Reson. 151: 48-59, (2001) doi:10.1006/jmre.2001.2353.
4. Samoson A., Tuherm T., Past J., Reinhold A., Anupõld T., Heinmaa I. (2005) New Horizons for Magic-Angle Spinning NMR. In: Klinowski J. (eds) New Techniques in Solid-State NMR. Topics in Current Chemistry, vol 246. Springer, Berlin, Heidelberg.
5. Marek D, "Cryo Head with a plurality of heat exchangers for cooling the RF coils or resonators", U.S. Pat. No. 7,141,979, 2006.
6. Doty F David, "NMR MAS probe with cryogenically cooled critical circuit components", U.S. Pat. No. 7,151,374, 2006.
7. Doty F D and Shevgoor S, "NMR MAS Inflow Bernoulli Bearing," U.S. Pat. No. 7,170,292, January 2007.
8. Doty F D, "NMR CryoMAS probe for high-field wide-bore magnets", U.S. Pat. No. 7,282,919, 2007.
9. Barnes A B, Mak-Jurkauskas M L, Matsuki Y, Bajaj V S, van der Wel P C A, DeRocher R, Bryant J, Sirigiri J R, Temkin R J, Lugtenburg J, Herzfeld J, Griffin R G, J. Magn. Reson. 198, 2, 261-270 (2009) doi:10.1016/j.jmr.2009.03.003.
10. Thurber T J, Yau W-M, Tycko R, Low-Temperature Dynamic Nuclear Polarization at 9.4 Tesla With a 30-mW Microwave Source, J. Magn. Reson., 204:303-313, (2010) doi:10.1016/j.jmr.2010.03.016
11. Shevgoor S and Doty F D, "NMR CryoMAS probe for high-field wide-bore magnets", U.S. Pat. No. 7,915,893, March 2011.
12. Matsuki Y, Ueda K, Idehara T, Ikeda R, Ogawa I, Nakamura S, Toda M, Anai T, Fujiwara T, "Helium-cooling and -spinning dynamic nuclear polarization for sensitivity-enhanced solid-state NMR at 14 T and 30 K", J. Magn. Reson., 225:1-9, (2012), DOI:10.1016/j.jmr.2012.09.008.
13. Pike K J, Kemp T F, Takahashi H, Day R, Howes A P, Kryukov E V, MacDonald J F, Collis A E C, Bolton D R, Wylde R J, Orwick M, Kosuga K, Clark A J, Idehara T, Watts A, Smith G M, Newton M E, Dupree R, "A spectrometer designed for 6.7 and 14.1 T DNP-enhanced solid-state MAS-NMR using quasi-optical microwave transmission", J. Magn. Reson., 216:1-9 (2012) doi: 10.1016/j.jmr.2011.12.006.
14. Horri F, Idehara T, Fujii Y, Ogawa I, Horri A, Entzminger G, Doty, F D, "Development of DNP-Enhanced High-Resolution Solid-State NMR System for the Characterization of Surface Structure of Polymer Materials", J Infrared Mili Terahz Waves 33, 756-765 (2012) doi: 10.1007/s10762-012-9874-1.
15. Armbruster M, Knott B, "NMR-MAS probehead with integral transport conduit for an MAS-rotor", U.S. Pat. No. 8,212,557, 2012.
16. Thurber K R, Potapov A, Yau W M, Tycko R, Solid-state NMR with MAS and DNP below 25 K, J. Magn. Reson., 226:100-106 (2013).
17. Bouleau E, Saint-Bonnet P, Mentink-Vigier F, Takahasi H, Jacquot J F, Bardet M, Aussenac F, Purea A, Engelke F, Hediger S, Lee D, De Paepe G, "Pushing NMR sensitivity limits using dynamic nuclear polarization with closed-loop cryogenic helium sample spinning", Chem. Sci. (2015), DOI:10.1039/c5sc02819a.
18. Matsuki Y, Nakamura S, Fukui S, Suematsu H, Fujiwara T, "Closed-cycle cold helium magic-angle spinning for sensitivity-enhanced multi-dimensional solid-state NMR", J. Magn. Reson., 259:76-81, (2015), DOI: 10.1016/j.jmr.2015.08.003.
19. Rosay M, Blank M, and Engelke F, "Instrumentation for solid-state dynamic nuclear polarization with magic angle spinning NMR", J. Magn. Reson., 264, (2016) 88-98. DOI:10.1016/j.jmr.2015.12.026.
20. Albert B J, Pahng H, Alaniva N, Sesti E L, Rand P W, Saliba E P, Scott F J, Choi E J, Barnes A B, "Instrumentation for cryogenic magic angle spinning dynamic nuclear polarization using 90 L of liquid nitrogen per day", J. Magn. Reson., 283:71-78, (2017). DOI:10.1016/j.jmr.2017.09.014.
21. Doty F D, "Guide to simulating complex NMR probe circuits", Concepts in Magn. Reson. Part A, 2019; e21463. 1-20. DOI:10.1002/cmr.a.21463.
22. Arcon D, Heinmaa K, and Stern R, Chapter 8. Low-temperature NMR: Techniques and Applications, in Modern Methods in Solid-state NMR, 231-61. Cambridge: Royal Society of Chemistry, 2018.
23. Sesti E L, Alaniva N, Rand P W, Choi E J, Albert B J, Pahng H, Saliba E P, Scott F J, Barnes A B, "Magic angle spinning NMR below 6 K with a computational fluid dynamics analysis of fluid flow and temperature gradients", J. Magn. Reson., 286:1-9, (2018). DOI:10.1016/j.jmr.2017.11.002
24. Bouleau E and De Paepe G, "Nuclear magnetic resonance analysis probe, device and method", U.S. Pat. No. 10,209,329, 2019.

25. Barnes A B, "Integrated EPR NMR with frequency agile gyrotron", U.S. Pat. No. 10,712,298, 2020.

I claim:

1. A ULT (ultra-low temperature) NMR (nuclear magnetic resonance) probe for insertion into an NMR magnet, the magnet having a center of field, the probe comprising:
   a probehead for containing a sample and an RE sample coil near the center of field, the probe having an end opposite the probehead,
   a probe base at the end of said probe opposite the probehead comprising a vacuum chamber and multiple connections to fluid lines,
   a probe body between said probehead and said base,
   a counterflow first exchanger extending from said probehead through said body into said vacuum chamber for cooling of a first spin gas, the counterflow first exchanger having a cold end and a warmer end,
   said counterflow first exchanger further characterized as comprising a first exchanger coolant inlet and a first exchanger spin gas outlet located in said probehead at the cold end of the first exchanger,
   a coolant dewared line for ducting a source coolant stream from said base into said probehead for distribution into said first exchanger coolant inlet,
   a counterflow second exchanger in said vacuum chamber, said counterflow second exchanger having a cooler end and a warmer end,
   said probe further characterized in that said warmer end of said counterflow first exchanger is connected to said cooler end of said counterflow second exchanger in said vacuum chamber, defining a series connection of said counterflow first exchanger and said counterflow second exchanger,
   said RF sample coil further characterized as receiving fluid from said first exchanger spin gas outlet.

2. The ULT NMR probe of claim 1 in which said counterflow first exchanger is further characterized as comprising two thermally joined tubes inside a dewared tube.

3. The ULT NMR probe of claim 1 in which said counterflow second exchanger is further characterized as comprising a coil of two thermally joined metallic tubes, said tubes further characterized as having inside diameter less than 6 mm.

4. The ULT NMR probe of claim 1 further characterized as comprising a heated bulkhead at the probehead end of said probe body.

5. The ULT NMR probe of claim 1 in which said counterflow second exchanger is further characterized as comprising two series connected coils of two thermally joined tubes.

6. The ULT NMR probe of claim 1 further characterized as comprising
   an overmoded waveguide for transmission of microwaves through said probe body to point-1 above and offset from said sample, and
   miter bends and waveguides for transmission of microwaves from said point-1 to point-2 above the sample for irradiation thereof.

7. The ULT NMR probe of claim 1 further characterized as comprising tuning coils and capacitors on a plurality of circuit boards between said bulkhead and said RE sample coil for tuning and matching said RE sample coil to multiple frequencies.

8. The ULT NMR probe of claim 1 in which said probehead is further characterized as being substantially surrounded by a vacuum jacketed shield.

9. The ULT NMR probe of claim 1 in which said counterflow first exchanger has a flow length and heat transfer surface area, and said counterflow second exchanger is further characterized as having a flow length and heat transfer surface area each greater than the flow length and heat transfer surface area of said counterflow first exchanger.

10. The ULT NMR probe of claim 1 further characterized as being designed for insertion into an NMR magnet from below its center of field.

11. The ULT NMR probe of claim 1 further characterized as comprising
   a counterflow third exchanger for cooling of a second spin gas, the third exchanger extending from said probehead through said body into said vacuum chamber, the counterflow third exchanger having a cold end and a warmer end,
   said third exchanger further characterized as comprising a third exchanger coolant inlet and a third exchanger spin gas outlet located in said probehead at the cold end of the third exchanger,
   said source coolant stream is further characterized as split for distribution into said first coolant inlet and third coolant inlet,
   a counterflow fourth exchanger in said vacuum chamber, said fourth exchanger having a cooler end and a warmer end,
   said probe further characterized as having said warmer end of said third exchanger connected to said cooler end of said fourth exchanger, defining a series connection of said third exchanger and said fourth exchanger,
   said RF sample coil further characterized as receiving fluid from said third exchanger spin gas outlet.

12. The ULT NMR probe of claim 11 further characterized as comprising a magic angle sample spinner with connections to first exchanger spin gas outlet and third exchanger spin gas outlet.

13. The ULT NMR probe of claim 11 further characterized as comprising a coupling on said vacuum chamber for supplying said coolant source stream into said coolant dewared line and at least three additional fluid couplings to counterflow exchangers in said vacuum chamber.

14. A method for use with a ULT NMR probe for insertion into an NMR magnet, the NMR magnet having a center of field, said probe comprising
   a probehead for containing a sample and a sample coil near the center of field, the probe having an end opposite the probehead,
   a probe base at the end of said probe opposite the probehead comprising a vacuum chamber and multiple connections to fluid lines,
   a probe body between said probehead and said base,
   a counterflow first exchanger extending from said probehead through said body into said vacuum chamber for cooling of a first spin gas, the counterflow first exchanger having a cold end and a warmer end,
   a coolant dewared line for ducting a source coolant stream from said base into said probehead for distribution to an inlet at the cold end of said counterflow first exchanger inlet,
   a counterflow second exchanger in said vacuum chamber, said counterflow second exchanger having a cooler end and a warmer end, the warmer end of the counterflow first exchanger connected with the cooler end of the counterflow second exchanger, defining a series connection of the counterflow first exchanger and the counterflow second exchanger, said method comprising the steps of:
  causing a source coolant stream to pass upward through said coolant dewared line and then downward through said inlet at the cold end of said counterflow first exchanger, causing first spin gas to pass through said counterflow second exchanger, and thence through said counterflow first exchanger, and thence to said sample coil, and
  exciting said sample coil with a radio frequency pulse at a frequency capable of inducing transverse magnetization of nuclear spins in said sample.

15. The method of claim 14 further comprising:
  before the step of causing source coolant stream to pass upward through said coolant dewared line and then downward through said counterflow first exchanger, inserting the ULT NMR probe into an NMR magnet from below; and
  after the step of exciting said sample coil with a radio frequency pulse at a frequency capable of inducing transverse magnetization of nuclear spins in said sample, withdrawing the ULT NMR probe from the NMR magnet from below.

16. The method of claim 14 further comprising receiving the coolant stream from the ULT NMR probe and passing the received coolant stream to a helium recycling system external from the ULT NMR probe.

17. The method of claim 14 further comprising receiving the first spin gas from the ULT NMR probe passing the received spin gas to a helium recycling system external from the ULT NMR probe.

* * * * *

UNITED STATES PATENT AND TRADEMARK OFFICE
CERTIFICATE OF CORRECTION

PATENT NO. : 12,332,329 B2
APPLICATION NO. : 18/873047
DATED : June 17, 2025
INVENTOR(S) : F David Doty Page 1 of 1

It is certified that error appears in the above-identified patent and that said Letters Patent is hereby corrected as shown below:

In the Specification

At Column 3, Line 7, "high-s" is hereby corrected to be "high-ε".

At Column 3, Line 22, "high-&" is hereby corrected to be "high-ε".

In the Claims

At Claim 1, Column 19, Line 8, "RE sample" is hereby corrected to be "RF sample".

At Claim 7, Column 19, Line 62, "RE sample" is hereby corrected to be "RF sample".

At Claim 7, Column 19, Line 63, "RE sample" is hereby corrected to be "RF sample".

Signed and Sealed this
Fifteenth Day of July, 2025

Coke Morgan Stewart
*Acting Director of the United States Patent and Trademark Office*